(12) United States Patent
Sato

(10) Patent No.: US 11,984,851 B2
(45) Date of Patent: May 14, 2024

(54) OSCILLATOR CIRCUIT, OSCILLATION METHOD, AND METHOD FOR ADJUSTING OSCILLATOR CIRCUIT

(71) Applicant: Asahi Kasei Microdevices Corporation, Tokyo (JP)

(72) Inventor: Takayuki Sato, Tokyo (JP)

(73) Assignee: Asahi Kasei Microdevices Corporation, Tokyo (JP)

( * ) Notice: Subject to any disclaimer, the term of this patent is extended or adjusted under 35 U.S.C. 154(b) by 0 days.

(21) Appl. No.: 17/976,875

(22) Filed: Oct. 31, 2022

(65) Prior Publication Data

US 2023/0179148 A1  Jun. 8, 2023

(30) Foreign Application Priority Data

Dec. 3, 2021  (JP) ................................ 2021-197270
Aug. 24, 2022  (JP) ................................ 2022-133340

(51) Int. Cl.
*H03B 5/30* (2006.01)
*H03L 7/093* (2006.01)
*H03L 7/099* (2006.01)

(52) U.S. Cl.
CPC .............. *H03B 5/30* (2013.01); *H03L 7/093* (2013.01); *H03L 7/0992* (2013.01)

(58) Field of Classification Search
CPC ......... H03L 7/093; H03L 7/0992; H03L 7/08; H03L 7/183; H03L 7/104
See application file for complete search history.

(56) References Cited

U.S. PATENT DOCUMENTS

| | | | |
|---|---|---|---|
| 5,053,726 A | 10/1991 | Christopher et al. | |
| 8,258,831 B1* | 9/2012 | Banai ................. | H03L 7/095 327/155 |
| 2004/0251979 A1 | 12/2004 | Pan | |
| 2010/0207694 A1* | 8/2010 | Miyata ............... | H03L 7/099 331/25 |

FOREIGN PATENT DOCUMENTS

| | | |
|---|---|---|
| JP | S5866423 | 4/1983 |
| JP | H08307254 | 11/1996 |
| JP | H08330999 | 12/1996 |
| JP | H11308102 | 11/1999 |
| JP | 2020136870 | 8/2020 |

* cited by examiner

*Primary Examiner* — Jeffrey M Shin
(74) *Attorney, Agent, or Firm* — JCIPRNET

(57) ABSTRACT

An oscillator circuit includes: an oscillator, oscillating a resonator and generating a first oscillation signal; and a PLL circuit, adjusting a ratio between a first frequency of the first oscillation signal and a second frequency of a second oscillation signal output from a voltage controlled oscillator, and controlling the oscillator based on a loop filter voltage being an input voltage of the voltage controlled oscillator.

12 Claims, 15 Drawing Sheets

OSCILLATOR CIRCUIT, OSCILLATION METHOD, AND METHOD FOR ADJUSTING OSCILLATOR CIRCUIT

CROSS-REFERENCE TO RELATED APPLICATIONS

This application claims the priority benefits of Japan Application No. 2021-197270, filed on Dec. 3, 2021, and Japan Application No. 2022-133340, filed on Aug. 24, 2022. The entirety of each of the above-mentioned patent applications is hereby incorporated by reference herein and made a part of this specification.

BACKGROUND

Technical Field

The present disclosure relates to an oscillator circuit, an oscillation method, and a method for adjusting an oscillator circuit.

Related Art

Conventionally, an oscillator circuit is known in which, when a spurious oscillation having a frequency higher than a main oscillation occurs in a crystal resonator (see FIG. 13), the oscillation with the crystal resonator is attenuated (see, for example, Patent Document 1).

[Patent Document 1] Japanese Patent Laid-open No. 2020-136870

However, in the conventional oscillator circuit, the spurious oscillation that occurs incidentally and less frequently than the main oscillation is waited for and then the oscillator is attenuated. For this reason, to detect the spurious oscillation with high accuracy, a frequency determination threshold is adjusted while the spurious oscillation is actually reproduced for each individual. However, this is difficult because the spurious oscillation occurs less frequently. Accordingly, it becomes difficult to adjust the frequency determination threshold for each individual, and a problem arises that detection accuracy of the spurious oscillation is not sufficient.

SUMMARY

An oscillator circuit according to one embodiment includes: an oscillator, oscillating a resonator and generating a first oscillation signal; and a phase locked loop (PLL) circuit, adjusting a ratio between a first frequency of the first oscillation signal and a second frequency of a second oscillation signal output from a voltage controlled oscillator, and controlling the oscillator based on a loop filter voltage being an input voltage of the voltage controlled oscillator.

An oscillation method according to one embodiment includes the following. By an oscillator, a resonator is oscillated and a first oscillation signal is generated. By a PLL circuit, a ratio between a first frequency of the first oscillation signal and a second frequency of a second oscillation signal output from a voltage controlled oscillator is adjusted. By the PLL circuit, the oscillator is controlled based on a loop filter voltage being an input voltage of the voltage controlled oscillator.

A method for adjusting an oscillator circuit according to one embodiment is a method for adjusting an oscillator circuit that includes an oscillator, a PLL circuit, and a control part. The method includes the following. By the oscillator, a resonator is oscillated and a first oscillation signal is generated. In a first adjustment step, a ratio between a first frequency of the first oscillation signal and a second frequency of a second oscillation signal output from a voltage controlled oscillator is adjusted by the control part so that a loop filter voltage input to a voltage controlled oscillator provided in the PLL circuit becomes a spurious oscillation equivalent voltage. In a second adjustment step, a first threshold is adjusted by the control part based on the loop filter voltage adjusted in the first adjustment step. In a third adjustment step, the ratio between the first frequency of the first oscillation signal and the second frequency of the second oscillation signal output from the voltage controlled oscillator is adjusted by the control part so that the loop filter voltage adjusted in the first adjustment step becomes a main oscillation equivalent voltage. In a fourth adjustment step, a second threshold is adjusted by the control part based on the loop filter voltage adjusted in the third adjustment step.

DESCRIPTION OF THE EMBODIMENTS

Figure 1:
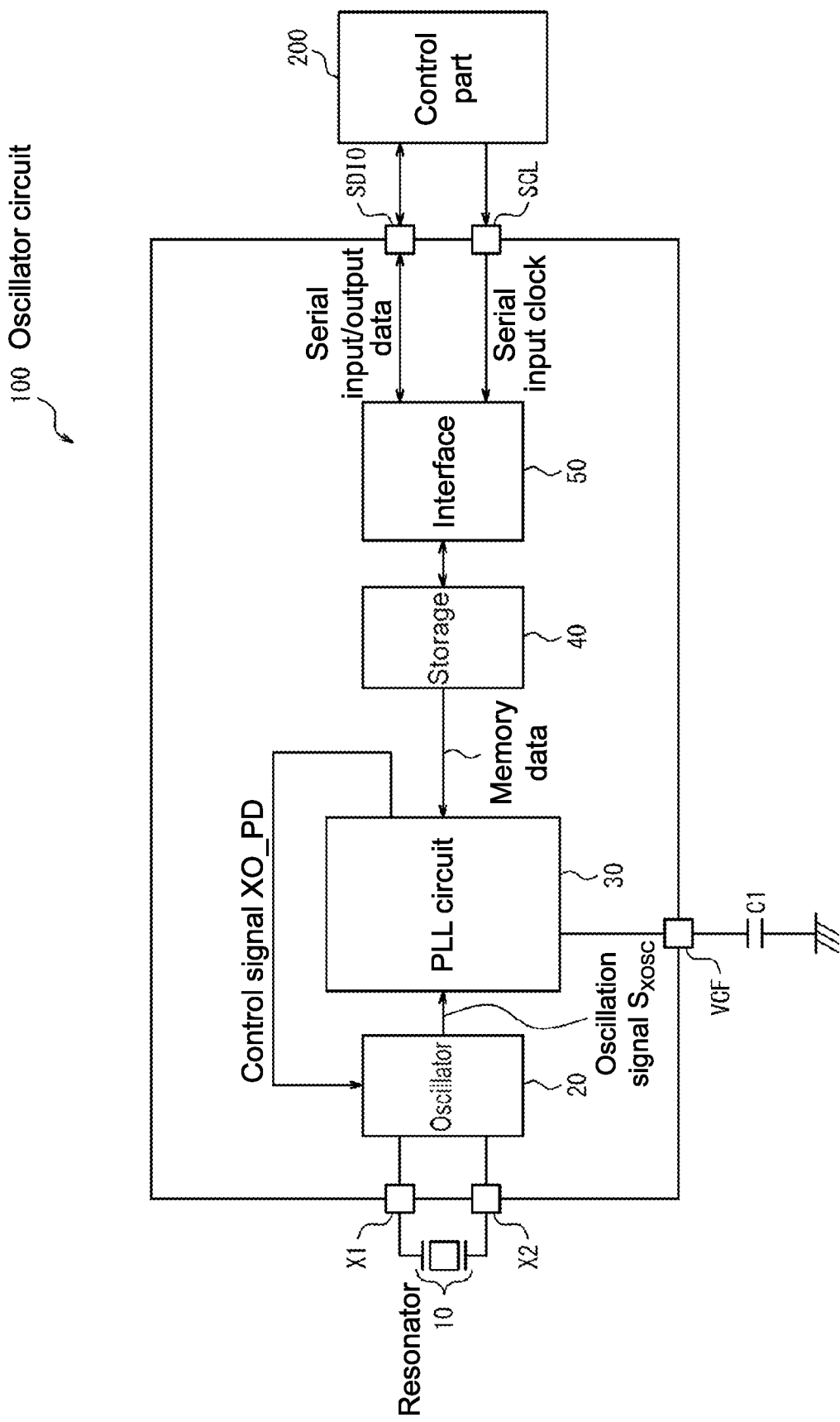
FIG. 1 illustrates an example of a configuration of an oscillator circuit according to a first embodiment.

According to the present disclosure, a highly accurate oscillator circuit can be provided.

Hereinafter, an embodiment of the disclosure will be described in detail with reference to the drawings. In principle, the same components are given the same reference numeral, and repeated description is omitted.

In this specification, a "main oscillation equivalent voltage" means a loop filter voltage when a resonator produces a main oscillation. A "spurious oscillation equivalent voltage" means a loop filter voltage when a resonator produces a spurious oscillation.

In this specification, a "main oscillation mode" means a mode in which an oscillation signal of an oscillator coincides with a main oscillation produced in a resonator. A "spurious oscillation mode" means a mode in which an oscillation signal of an oscillator coincides with a spurious oscillation produced in a resonator. A "power down mode" means a mode in which an oscillation signal of an oscillator is attenuated. However, these terms are defined for convenience only and should not be construed as limiting.

First Embodiment

[Oscillator Circuit]

Figure 2:
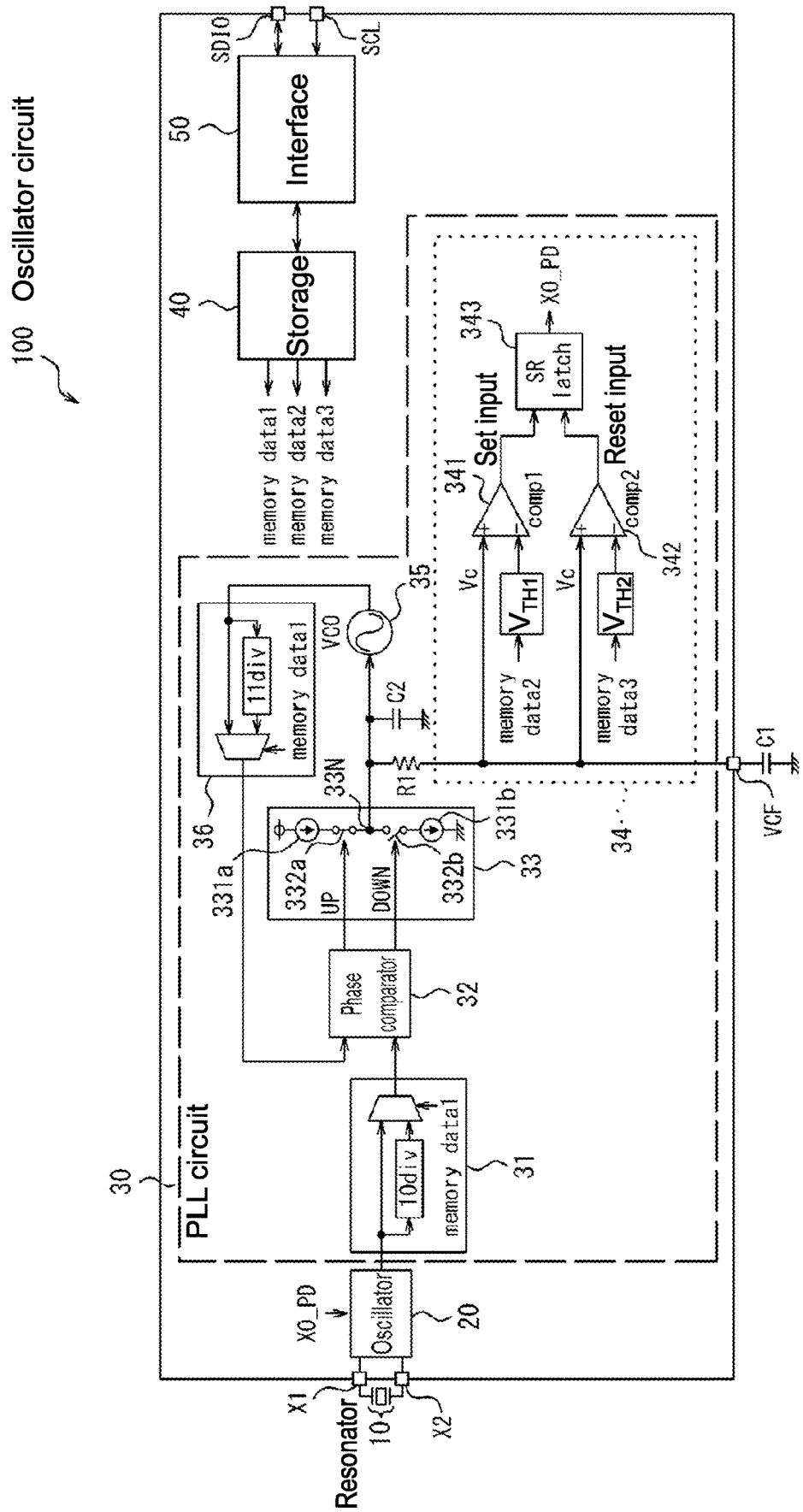
FIG. 2 illustrates an example of a configuration of the oscillator circuit according to the first embodiment.

An example of a configuration of an oscillator circuit 100 according to a first embodiment is described with reference to FIG. 1 and FIG. 2.

The oscillator circuit 100 includes a resonator 10, an oscillator 20, a phase locked loop (PLL) circuit 30, a storage 40, and an interface 50. The PLL circuit 30 includes a first frequency divider 31, a phase comparator 32, a charge pump 33, an attenuation control circuit 34, a voltage controlled oscillator 35, and a second frequency divider 36. The oscillator circuit 100 is connected via an input/output terminal SDIO and an input terminal SCL to a control part 200 provided outside the oscillator circuit 100. Although FIG. 1 illustrates a case where the control part 200 is provided outside the oscillator circuit 100 as an example, it does not matter if the control part 200 is provided inside the oscillator circuit 100. In this specification, the first frequency divider 31 and the second frequency divider 36 may be collectively referred to as a frequency divider circuit.

The resonator 10 is a resonator that produces a main oscillation called a C mode or a spurious oscillation called a B mode, and may be, for example, an SC-cut crystal resonator, an AT-cut crystal resonator, a microelectromechanical systems (MEMS) resonator, or a ceramic resonator. The resonator 10 is connected to the oscillator 20 via a connection terminal X1 and a connection terminal X2. For example, in the case where the resonator 10 is an SC-cut crystal resonator, a frequency of the spurious oscillation is about 10% higher than a frequency of the main oscillation.

The oscillator 20 oscillates the resonator 10 and generates an oscillation signal (first oscillation signal) $S_{XOSC}$. The oscillator 20 outputs the oscillation signal $S_{XOSC}$ to the PLL circuit 30.

The oscillator 20 is controlled based on a control signal XO_PD input from the PLL circuit 30. For example, when the control signal XO_PD input from the PLL circuit 30 switches from "Low voltage" to "High voltage", the oscillator 20 switches the oscillation signal $S_{XOSC}$ from a spurious oscillation mode to a power down mode (see FIG. 4).

In the PLL circuit 30, by appropriately adjusting a division ratio M1 of the first frequency divider 31 and a division ratio M2 of the second frequency divider 36 based on first memory data stored in the storage 40, a multiplication ratio of a frequency (first frequency) $f_{XOSC}$ of the oscillation signal $S_{XOSC}$ is adjusted. For example, the PLL circuit 30 adjusts the multiplication ratio so that a ratio between the frequency $f_{XOSC}$ of the oscillation signal $S_{XOSC}$ generated by the oscillator 20 and a frequency (second frequency) $f_{VCO}$ of an oscillation signal (second oscillation signal) $S_{VCO}$ output from the voltage controlled oscillator 35 becomes 1:1 or 10:11. A value of the multiplication ratio is not particularly limited, and may be adjusted to any value by appropriately setting the first memory data by the control part 200. In the drawings, a case where (M1, M2) is (10div, 11div) is described as an example. However, a value of the division ratio M1 or the division ratio M2 is not particularly limited. The division ratio M1 or the division ratio M2 may be, for example, any integer. The division ratio M1 or the division ratio M2 may be, for example, a fractional division ratio realized by using a fractional frequency divider.

The first memory data is adjustment data for adjusting the multiplication ratio of the frequency $f_{XOSC}$ of the oscillation signal $S_{XOSC}$. The first memory data may include, for example, data indicating the division ratio M1 of the first frequency divider 31 and data indicating the division ratio M2 of the second frequency divider 36.

In the PLL circuit 30, by comparing a loop filter voltage $V_C$ being an input voltage of the voltage controlled oscillator 35 with a first threshold $V_{TH1}$ being a voltage greater than a main oscillation equivalent voltage $V_{C1}$ and less than a spurious oscillation equivalent voltage $V_{C2}$ (main oscillation equivalent voltage $V_{C1}$<first threshold $V_{TH1}$<spurious oscillation equivalent voltage $V_{C2}$) using second memory data stored in the storage 40, the control signal XO_PD for controlling the oscillator 20 is generated. Alternatively, in the PLL circuit 30, by comparing the loop filter voltage $V_C$ being the input voltage of the voltage controlled oscillator 35 with a second threshold $V_{TH2}$ being a voltage less than the main oscillation equivalent voltage $V_{C1}$ (second threshold $V_{TH2}$<main oscillation equivalent voltage $V_{C1}$) using third memory data stored in the storage 40, the control signal XO_PD for controlling the oscillator 20 is generated. The PLL circuit 30 outputs the control signal XO_PD to the oscillator 20. The loop filter voltage $V_C$, the first threshold $V_{TH1}$, and the second threshold $V_{TH2}$ may be digital values by a digital circuit, instead of voltages. The voltage controlled oscillator 35 may be a digitally controlled oscillator in which an input signal is a digital value instead of a voltage.

A value of each of the first threshold $V_{TH1}$ and the second threshold $V_{TH2}$ is not particularly limited. In this specification, a case where the second threshold $V_{TH2}$<the first threshold $V_{TH1}$ is described as an example. However, it is of course possible that the first threshold $V_{TH1}$<the second threshold $V_{TH2}$. In this specification, a case where an oscillation frequency of the voltage controlled oscillator 35 increases as the loop filter voltage $V_C$ increases is described as an example. However, the oscillation frequency of the voltage controlled oscillator 35 may decrease as the loop filter voltage $V_C$ increases.

Figure 4:
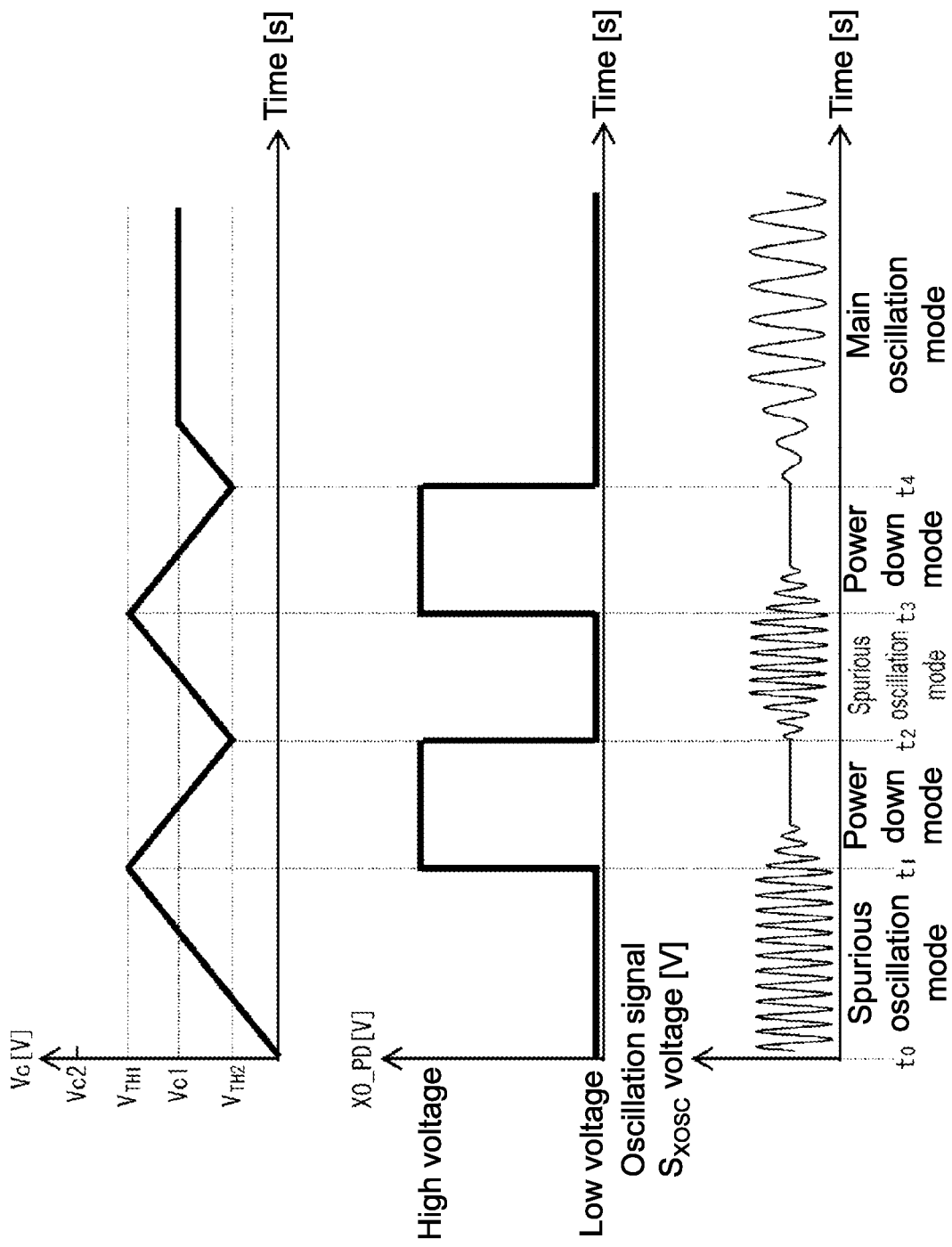
FIG. 4 is a timing chart illustrating an example of an operation of the oscillator circuit according to the first embodiment.

The second memory data is determination data for determining whether to attenuate the oscillator 20, that is, whether to put the oscillation signal $S_{XOSC}$ in the oscillator 20 into the power down mode (see FIG. 4). The second memory data may include, for example, data indicating the first threshold $V_{TH1}$. The second memory data may include data set by the control part 200 based on experimental data manually input to the control part 200 in advance. Alternatively, the second memory data may include data set by the control part 200 using a program determining a measured value or the like. A method for setting the second memory data is not particularly limited.

The third memory data is determination data for determining whether to oscillate the oscillator 20, that is, whether to cancel the power down mode of the oscillation signal $S_{XOSC}$ in the oscillator 20 (see FIG. 4). The third memory data may include, for example, data indicating the second threshold $V_{TH2}$. The third memory data may include data set by the control part 200 based on the experimental data manually input to the control part 200 in advance. Alternatively, the third memory data may include data set by the control part 200 using a program determining a measured value or the like. A method for setting the third memory data is not particularly limited.

For example, in the case where the loop filter voltage $V_C$ is greater than the first threshold $V_{TH1}$, the PLL circuit 30 generates the control signal XO_PD for attenuating the oscillator 20, and attenuates the oscillator 20. For example, in the case where the loop filter voltage $V_C$ is less than the second threshold $V_{TH2}$, the PLL circuit 30 generates the control signal XO_PD for oscillating the oscillator 20, and oscillates the oscillator 20.

The storage 40 may be, for example, a non-volatile memory or a one-time memory. The storage 40 stores the first memory data, the second memory data, and the third memory data. The storage 40 may store any information used in operation of the oscillator circuit 100. The storage 40 acquires the first memory data, the second memory data, and the third memory data from the control part 200 via the interface 50. It is preferable that the various data stored in the storage 40 be properly used in accordance with product testing, product shipment, or the like.

The interface 50 is provided between the storage 40 and the control part 200 that is provided outside the oscillator circuit 100, and provides a communication interface. The interface 50 may be, for example, a serial interface such as an inter-integrated circuit (I2C) interface or a serial peripheral interface (SPI).

The control part 200 sets the first memory data, the second memory data, and the third memory data. For example, the control part 200 sets the data indicating the division ratio M1 of the first frequency divider 31 and the data indicating the division ratio M2 of the second frequency divider 36. For example, the control part 200 sets the data indicating the first threshold $V_{TH1}$ and the data indicating the second threshold $V_{TH2}$. The control part 200 outputs the first memory data, the second memory data and the third memory data to the storage 40 via the interface 50.

The oscillator circuit 100 according to the first embodiment adjusts the multiplication ratio of the frequency $f_{XOSC}$ of the oscillation signal $S_{XOSC}$ generated by the oscillator 20, and controls the oscillator 20 based on the loop filter voltage $V_C$ being the input voltage of the voltage controlled oscillator 35. Accordingly, even if an input is a main oscillation, since it is possible to virtually produce a spurious oscillation that occurs incidentally and less frequently than the main oscillation and adjust a voltage threshold for determining the loop filter voltage $V_C$ equivalent to the spurious oscillation with high accuracy, the oscillator circuit 100 with high accuracy can be realized.

[PLL Circuit]

An example of a configuration of the PLL circuit 30 according to the first embodiment is described with reference to FIG. 2.

The first frequency divider 31 divides the oscillation signal $S_{XOSC}$ at the division ratio M1 using the first memory data, and generates a frequency divided signal $S_{XOSC/DIV}$. A frequency of the frequency divided signal $S_{XOSC/DIV}$ is obtained by multiplying the frequency $f_{XOSC}$ of the oscillation signal $S_{XOSC}$ by (1/M1). The first frequency divider 31 outputs the frequency divided signal $S_{XOSC/DIV}$ to the phase comparator 32. The first frequency divider 31 may be, for example, a known integer frequency divider or fractional frequency divider. The division ratio M1 may be any value.

The voltage controlled oscillator 35 generates the oscillation signal $S_{VCO}$ having the frequency $f_{VCO}$ proportional to an input voltage. The voltage controlled oscillator 35 outputs the oscillation signal $S_{VCO}$ to the second frequency divider 36.

The second frequency divider 36 divides the oscillation signal $S_{VCO}$ at the division ratio M2 using the first memory data, and generates a frequency divided signal $S_{VCO/DIV}$. A frequency of the frequency divided signal $S_{VCO/DIV}$ is obtained by multiplying the frequency $f_{VCO}$ of the oscillation signal $S_{VCO}$ by (1/M2). The second frequency divider 36 outputs the frequency divided signal $S_{VCO/DIV}$ to the phase comparator 32. The second frequency divider 36 may be, for example, a known integer frequency divider or fractional frequency divider. The division ratio M2 may be any value.

The phase comparator 32 compares a phase of the frequency divided signal $S_{XOSC/DIV}$ input from the first frequency divider 31 with a phase of the frequency divided signal $S_{VCO/DIV}$ input from the second frequency divider 36, and generates a phase comparison signal SCUM (for example, a pulse-like UP signal or a pulse-like DOWN signal) corresponding to a phase difference. The phase comparator 32 outputs the phase comparison signal $S_{COM}$ to the charge pump 33. The phase comparator 32 may be, for example, a known frequency mixer, exclusive OR (XOR) detector, or time to digital converter (TDC).

Based on the phase comparison signal $S_{COM}$ input from the phase comparator 32, the charge pump 33 generates a charge pump current that charges or discharges a node 33N. The charge pump 33 may include, for example, a constant current source 331a, a switching transistor 332a, a switching transistor 332b, and a constant current source 331b.

The attenuation control circuit 34 detects the loop filter voltage $V_C$ being the input voltage of the voltage controlled oscillator 35, and, based on the loop filter voltage $V_C$, generates the control signal XO_PD for controlling the oscillator 20 using the second memory data and the third memory data. The attenuation control circuit 34 outputs the control signal XO_PD to the oscillator 20.

The attenuation control circuit 34 may include, for example, a comparator 341, a comparator 342, and a Set-Reset (SR) latch circuit 343.

The comparator 341 compares the loop filter voltage $V_C$ with the first threshold $V_{TH1}$ and outputs a comparison result to a Set terminal of the SR latch circuit 343. For example, in the case where the loop filter voltage $V_C$ is greater than the first threshold $V_{TH1}$, the comparator 341 generates a high level signal; in the case where the loop filter voltage $V_C$ is less than or equal to the first threshold $V_{TH1}$, the comparator 341 generates a low level signal.

The comparator 342 compares the loop filter voltage $V_C$ with the second threshold $V_{TH2}$ and outputs a comparison result to a Reset terminal of the SR latch circuit 343. For example, in the case where the loop filter voltage $V_C$ is equal to or greater than the second threshold $V_{TH2}$, the comparator 342 generates a high level signal; in the case where the loop filter voltage $V_C$ is less than the second threshold $V_{TH2}$, the comparator 342 generates a low level signal.

Based on the comparison result input from the comparator 341 and the comparison result input from the comparator 342, the SR latch circuit 343 generates the control signal XO_PD. For example, in the case where a comparison result indicating that the loop filter voltage $V_C$ is greater than the first threshold $V_{TH1}$ is acquired, the SR latch circuit 343 generates the control signal XO_PD for attenuating the oscillator 20. For example, in the case where a comparison result indicating that the loop filter voltage $V_C$ is less than the second threshold $V_{TH2}$ is acquired, the SR latch circuit 343 generates the control signal XO_PD for oscillating the oscillator 20.

Here, a relationship between the loop filter voltage $V_C$ [V] and the frequency $f_{VCO}$ [Hz] of a voltage controlled oscillator in the case where the resonator 10 is an SC-cut crystal resonator is described with reference to FIG. 3A and FIG. 3B.

Figure 3A:
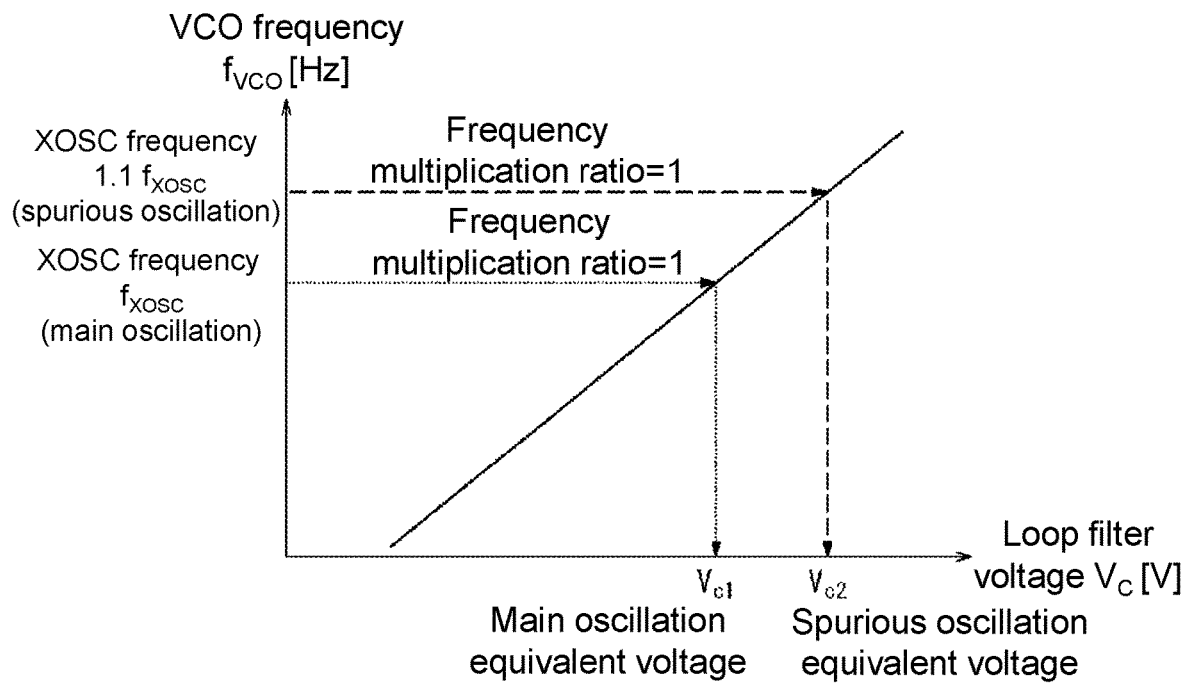
FIG. 3A illustrates an example of a relationship between a loop filter voltage and an oscillation frequency of a voltage controlled oscillator in a conventional PLL circuit.

FIG. 3A illustrates a relationship between the loop filter voltage $V_C$ [V] and the frequency $f_{VCO}$ [Hz] of the oscillation signal $S_{VCO}$ output from a voltage controlled oscillator in a conventional PLL circuit 30' in which the multiplication ratio of the frequency $f_{XOSC}$ of the oscillation signal $S_{XOSC}$ cannot be adjusted.

Figure 3B:
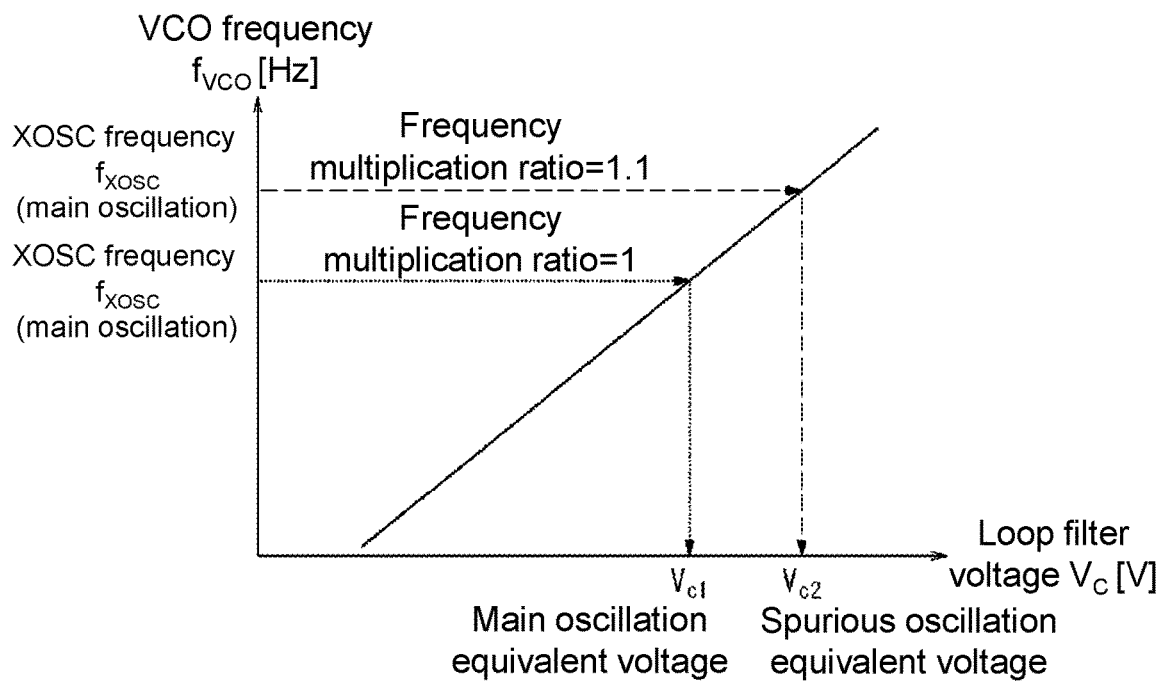
FIG. 3B illustrates an example of a relationship between a loop filter voltage and an oscillation frequency of a voltage controlled oscillator in a PLL circuit according to the first embodiment.

FIG. 3B illustrates a relationship between the loop filter voltage $V_C$ [V] and the frequency $f_{VCO}$ [Hz] of the oscillation signal $S_{VCO}$ output from a voltage controlled oscillator in the PLL circuit 30 according to the present embodiment in which the multiplication ratio of the frequency $f_{XOSC}$ of the oscillation signal $S_{XOSC}$ can be adjusted.

The following is clear from FIG. 3A. That is, in the conventional PLL circuit 30', since the frequency multiplication ratio is fixed to 1, in order for the frequency $f_{VCO}$ when the loop filter voltage $V_C$ is the main oscillation equivalent voltage $V_{C1}$ to match the frequency $f_{XOSC}$ of a main oscillation mode, the resonator 10 must be in a state of producing a main oscillation; in order for the frequency $f_{VCO}$ when the loop filter voltage $V_C$ is the spurious oscillation equivalent voltage $V_{C2}$ to match a frequency of $1.1 \times f_{XOSC}$ of a spurious oscillation mode, the resonator 10 must be in a state of producing a spurious oscillation.

On the other hand, the following is clear from FIG. 3B. That is, in the PLL circuit 30 according to the present embodiment, since the frequency multiplication ratio may be switched to 1 or 1.1, either when the frequency $f_{VCO}$ with which the loop filter voltage $V_C$ is the main oscillation equivalent voltage $V_{C1}$ matches the frequency $f_{XOSC}$ of the main oscillation mode, or when the frequency $f_{VCO}$ with which the loop filter voltage $V_C$ is the spurious oscillation equivalent voltage $V_{C2}$ matches the frequency of $1.1 \times f_{XOSC}$ of the spurious oscillation mode, the resonator 10 can be in the state of producing the main oscillation.

As described above, in the oscillator circuit 100 according to the present embodiment, the PLL circuit 30 adjusts the multiplication ratio of the frequency $f_{XOSC}$ of the oscillation signal $S_{XOSC}$, detects the frequency, and controls attenuation of the oscillator 20. Accordingly, without waiting for the spurious oscillation that occurs incidentally and less frequently than the main oscillation as in the conventional oscillator circuit, a state as if the resonator 10 were generating the spurious oscillation can be virtually reproduced, and the oscillator 20 can be properly controlled. Accordingly, the oscillator circuit 100 with high accuracy can be realized.

[Timing Chart]

An example of an operation of the oscillator circuit 100 according to the first embodiment is described with reference to a timing chart shown in FIG. 4.

During time t0 to time t1, the attenuation control circuit 34 detects that the loop filter voltage $V_C$ is rising and keeps the control signal XO_PD at "Low voltage". The oscillation signal $S_{XOSC}$ in the oscillator 20 is in the spurious oscillation mode.

At time t1, the attenuation control circuit 34 detects that the loop filter voltage $V_C$ has become greater than the first threshold $V_{TH1}$ (main oscillation equivalent voltage $V_{C1}$<first threshold $V_{TH1}$<spurious oscillation equivalent voltage $V_{C2}$), and switches the control signal XO_PD from "Low voltage" to "High voltage". The oscillation signal $S_{XOSC}$ in the oscillator 20 changes from the spurious oscillation mode to the power down mode.

During time t1 to time t2, the attenuation control circuit 34 detects that the loop filter voltage $V_C$ is falling and keeps the control signal XO_PD at "High voltage". The oscillation signal $S_{XOSC}$ in the oscillator 20 is in the power down mode.

At time t2, the attenuation control circuit 34 detects that the loop filter voltage $V_C$ has become less than the second threshold $V_{TH2}$ (second threshold $V_{TH2}$<main oscillation equivalent voltage $V_{C1}$), and switches the control signal XO_PD from "High voltage" to "Low voltage". The power down mode of the oscillation signal $S_{XOSC}$ in the oscillator 20 is canceled.

During time t2 to time t3, the attenuation control circuit 34 detects that the loop filter voltage $V_C$ is rising and keeps the control signal XO_PD at "Low voltage". The oscillation signal $S_{XOSC}$ in the oscillator 20 is in the spurious oscillation mode.

At time t3, it is detected that the loop filter voltage $V_C$ has become greater than the first threshold $V_{TH1}$, and the control signal XO_PD is switched from "Low voltage" to "High voltage". The oscillation signal $S_{XOSC}$ in the oscillator 20 changes from the spurious oscillation mode to the power down mode.

During time t3 to time t4, the attenuation control circuit 34 detects that the loop filter voltage $V_C$ is falling and keeps the control signal XO_PD at "High voltage". The oscillation signal $S_{XOSC}$ in the oscillator 20 is in the power down mode.

At time t4, the attenuation control circuit 34 detects that the loop filter voltage $V_C$ has become less than the second threshold $V_{TH2}$, and switches the control signal XO_PD from "High voltage" to "Low voltage". The power down mode of the oscillation signal $S_{XOSC}$ in the oscillator 20 is canceled.

After time t4, the attenuation control circuit 34 detects that the loop filter voltage $V_C$ has converged to the main oscillation equivalent voltage $V_{C1}$, and keeps the control signal XO_PD at "Low voltage". The oscillation signal $S_{XOSC}$ in the oscillator 20 is in the main oscillation mode.

As described above, the PLL circuit 30 repeats putting the oscillation signal $S_{XOSC}$ in the oscillator 20 into the power down mode and canceling the power down mode of the oscillation signal $S_{XOSC}$ in the oscillator 20 until the loop filter voltage $V_C$ converges to the main oscillation equivalent voltage $V_{C1}$. Accordingly, the oscillator circuit 100 can be realized in which oscillation in the main oscillation mode can be stably maintained even in the case of using a relatively low cost resonator in which the spurious oscillation mode is likely to occur.

[Operation of Oscillator Circuit]

Figure 5:
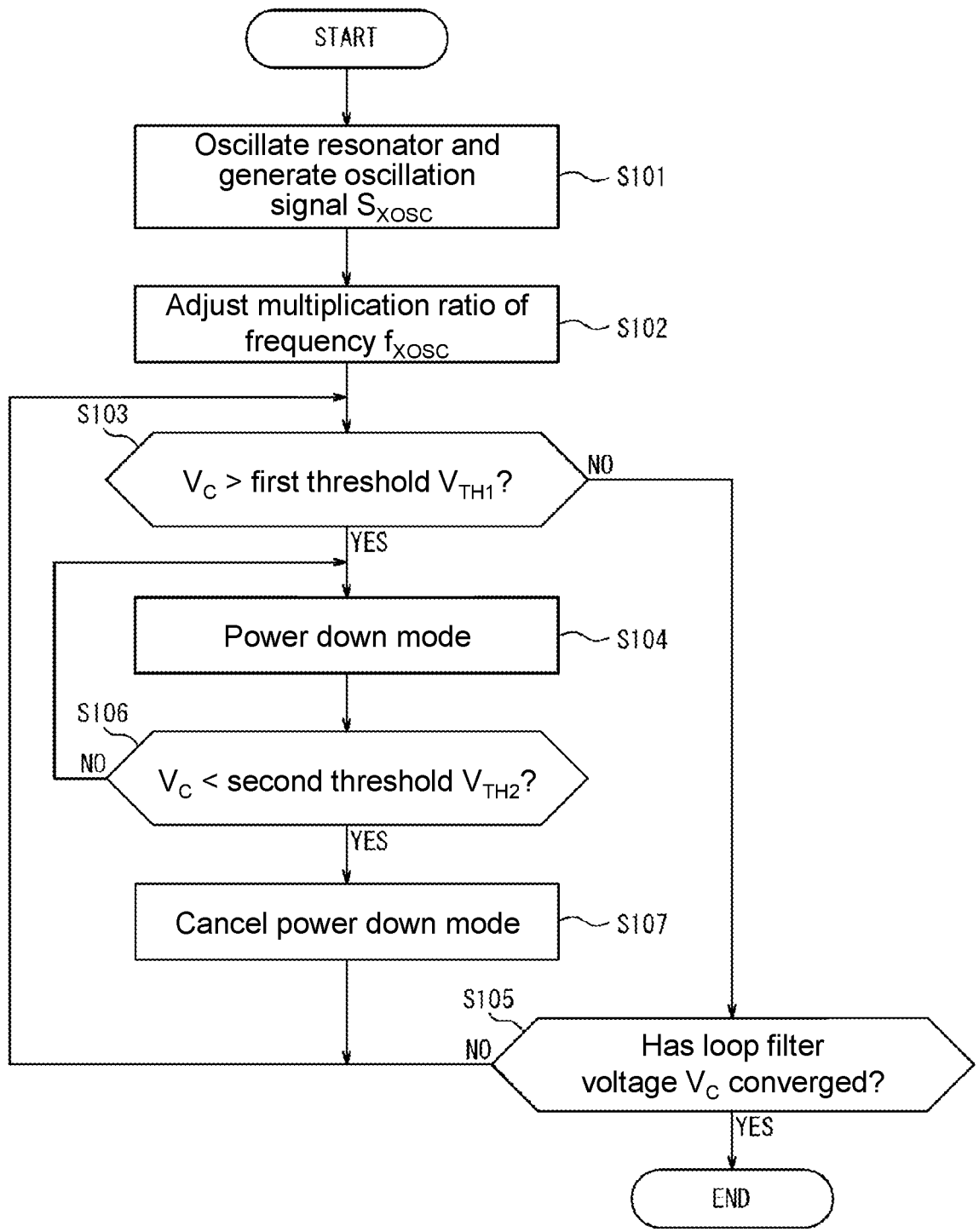
FIG. 5 is a flowchart illustrating an example of an oscillation method according to the first embodiment.

An example of an oscillation method in the oscillator circuit 100 according to the first embodiment is described with reference to FIG. 5.

In step S101, the oscillator circuit 100 oscillates the resonator 10 and generates the oscillation signal $S_{XOSC}$.

In step S102, the oscillator circuit 100 adjusts a ratio between the frequency $f_{XOSC}$ of the oscillation signal $S_{XOSC}$ generated by the oscillator 20 and the frequency $f_{VCO}$ of the oscillation signal $S_{VCO}$ output from the voltage controlled oscillator 35. It can be said that the oscillator circuit 100 is waiting until a phase locking operation of the PLL circuit 30 is completed and the loop filter voltage $V_C$ converges to a constant value.

In step S103, the oscillator circuit 100 determines whether the loop filter voltage $V_C$ is greater than the first threshold $V_{TH1}$. If the loop filter voltage $V_C$ is greater than the first threshold $V_{TH1}$ (step S103→YES), the oscillator circuit 100 performs the processing of step S104. If the loop filter voltage $V_C$ is less than or equal to the first threshold $V_{TH1}$ (step S103→NO), the oscillator circuit 100 performs the processing of step S105.

In step S104, the oscillator circuit 100 attenuates the oscillator 20. The oscillation signal $S_{XOSC}$ in the oscillator 20 is put into the power down mode.

In step S105, the oscillator circuit 100 determines whether the loop filter voltage $V_C$ has converged to the main oscillation equivalent voltage $V_{C1}$. If the loop filter voltage $V_C$ has converged to the main oscillation equivalent voltage $V_{C1}$ (step S105→YES), the oscillator circuit 100 ends the processing. If the loop filter voltage $V_C$ has not converged to the main oscillation equivalent voltage $V_{C1}$ (step S105→NO), the oscillator circuit 100 performs the processing of step S103 again. Here, a condition for determining that the loop filter voltage $V_C$ is the main oscillation equivalent voltage $V_{C1}$ is that the loop filter voltage $V_C$ is less than or equal to the first threshold $V_{TH1}$ and equal to or greater than the second threshold $V_{TH2}$.

In step S106, the oscillator circuit 100 determines whether the loop filter voltage $V_C$ is less than the second threshold $V_{TH2}$. If the loop filter voltage $V_C$ is less than the second threshold $V_{TH2}$ (step S106→YES), the oscillator circuit 100 performs the processing of step S107. If the loop filter voltage $V_C$ is equal to or greater than the second threshold $V_{TH2}$ (step S106→NO), the oscillator circuit 100 continues the processing of step S104.

In step S107, the oscillator circuit 100 oscillates the oscillator 20. The power down mode of the oscillation signal $S_{XOSC}$ in the oscillator 20 is canceled. If the spurious oscillation mode has occurred, by repeating a loop of step S103→step S104→step S106→step S107→step S103→ . . . and so on, it is possible to transition to the main oscillation mode.

[Method for Adjusting Spurious Oscillation and Main Oscillation Determination Threshold]

Figure 14:
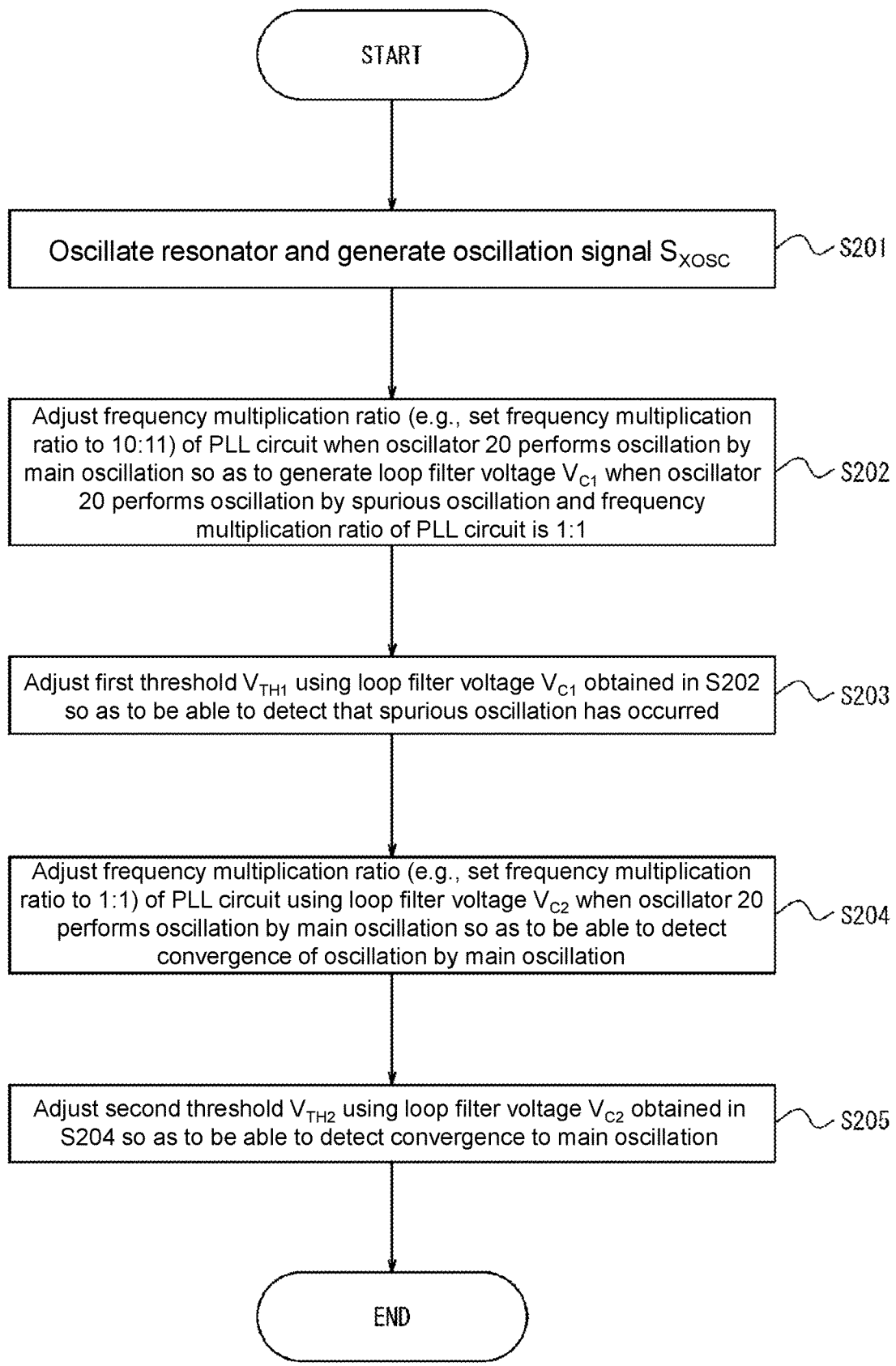
FIG. 14 is a flowchart illustrating an example of a method for adjusting an oscillator circuit according to the first embodiment.

An example of an adjustment method in the oscillator circuit 100 according to the first embodiment is described with reference to FIG. 14.

In step S201, the oscillator circuit 100 (for example, the oscillator 20) oscillates the resonator 10 and generates the oscillation signal $S_{XOSC}$.

In step S202, the oscillator circuit 100 (for example, the control part 200) adjusts a frequency multiplication ratio of the PLL circuit 30 when the oscillator 20 performs oscillation by main oscillation so as to generate the loop filter voltage $V_{C1}$ when the oscillator 20 performs oscillation by spurious oscillation and the frequency multiplication ratio of the PLL circuit 30 is 1:1 (first adjustment step). For example, the frequency multiplication ratio may be 10:11.

In step S203, the oscillator circuit 100 (for example, the control part 200) adjusts the first threshold $V_{TH1}$ using the loop filter voltage $V_{C1}$ obtained in step S202 so as to be able to detect that a spurious oscillation has occurred (second adjustment step). For example, in the case of a characteristic that an oscillation frequency of the voltage controlled oscillator 35 monotonously increases with respect to a loop filter voltage, the first threshold $V_{TH1}$ may be adjusted to be less than or equal to the loop filter voltage $V_{C1}$, and a determination signal as to whether the loop filter voltage $V_{C1}$ is equal to or greater than the first threshold $V_{TH1}$ may be used as a spurious oscillation detection signal.

In step S204, the oscillator circuit 100 (for example, the control part 200) adjusts the frequency multiplication ratio of the PLL circuit 30 using the loop filter voltage $V_{C2}$ when the oscillator 20 performs oscillation by main oscillation so as to be able to detect convergence of the oscillation by main oscillation (third adjustment step). For example, the frequency multiplication ratio may be 1:1.

In step S205, the oscillator circuit 100 (for example, the control part 200) adjusts the second threshold $V_{TH2}$ using the loop filter voltage $V_{C2}$ obtained in step S204 so as to be able to detect the convergence to the main oscillation (fourth adjustment step). For example, in the case of the characteristic that the oscillation frequency of the voltage controlled oscillator 35 monotonously increases with respect to the loop filter voltage, the second threshold $V_{TH2}$ may be adjusted to be less than or equal to the loop filter voltage $V_{C2}$, and a determination signal as to whether the loop filter voltage $V_{C2}$ has converged to the second threshold $V_{TH2}$ or greater may be used as a main oscillation convergence detection signal.

As described above, by applying the oscillation method according to the first embodiment, the oscillator circuit 100 with high accuracy can be realized. In a general resonator, there exists a harmonic oscillation mode having a frequency of $M*f_{OSC}$ (M is an integer equal to or greater than 2) being an integral multiple of a frequency $f_{OSC}$ of a fundamental oscillation mode. For example, if a frequency of the spurious oscillation mode is higher than a frequency of the main oscillation mode, like (main, spurious)=$(1*f_{OSC}, 2*f_{OSC})$ or (main, spurious)=$(2*f_{OSC}, 3*f_{OSC})$, by selecting an optimum value as the first threshold $V_{TH1}$, the second threshold $V_{TH2}$, the division ratio M1, and the division ratio M2, spurious oscillation can be suppressed. For example, in the case of (main, spurious)=$(1*f_{OSC}, 2*f_{OSC})$, by selecting 1 for the division ratio M1 and 2 for the division ratio M2, the loop filter voltage can be set to the voltage $V_{C1}$ equivalent to the spurious oscillation mode even if a resonator oscillates in the main oscillation mode. Accordingly, the first threshold $V_{TH1}$ can be adjusted with high accuracy. By selecting 1 for the division ratio M1 and also for the division ratio M2, the loop filter voltage can be set to the voltage $V_{C2}$ equivalent to the main oscillation mode. Accordingly, the second threshold $V_{TH2}$ can be adjusted to the optimum value.

Second Embodiment

Figure 6:
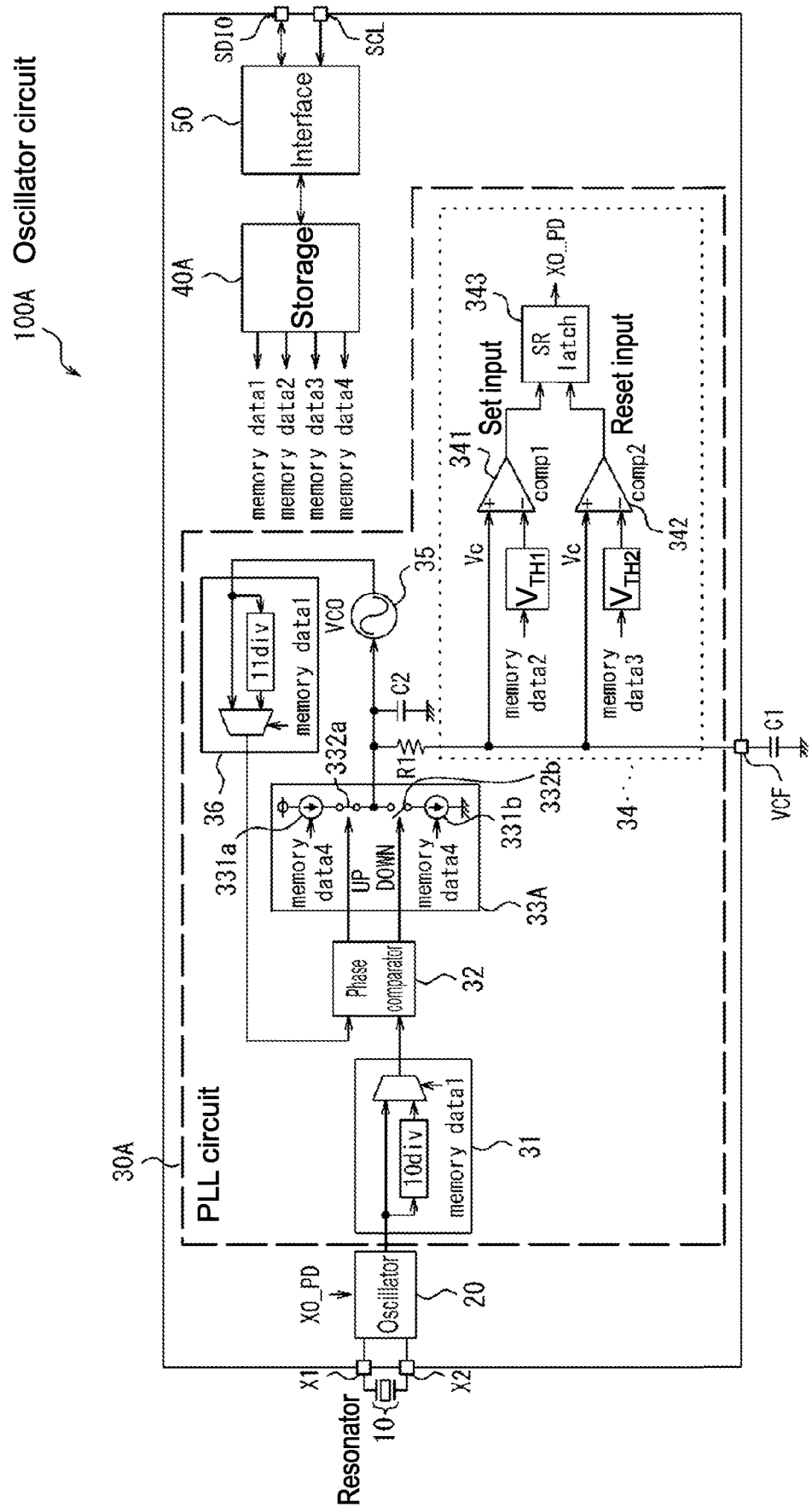
FIG. 6 illustrates an example of a configuration of an oscillator circuit according to a second embodiment.

An example of a configuration of an oscillator circuit 100A according to a second embodiment is described with reference to FIG. 6, FIG. 7A and FIG. 7B.

The oscillator circuit 100A according to the second embodiment differs from the oscillator circuit 100 according to the first embodiment in that, while the oscillator circuit 100 according to the first embodiment is unable to adjust a charge pump current, the oscillator circuit 100A according to the second embodiment is able to adjust a charge pump current. The other configurations are the same as those of the oscillator circuit 100 according to the first embodiment, and thus repeated description is omitted.

The oscillator circuit 100A includes the resonator 10, the oscillator 20, a PLL circuit 30A, a storage 40A, and the interface 50. The PLL circuit 30A includes the first frequency divider 31, the phase comparator 32, a charge pump 33A, the attenuation control circuit 34, the voltage controlled oscillator 35, and the second frequency divider 36.

By appropriately adjusting a charge pump current using fourth memory data stored in the storage 40A, the charge pump 33A adjusts a rise time during which the loop filter voltage $V_C$ rises or a fall time during which the loop filter voltage $V_C$ falls.

The fourth memory data is adjustment data for adjusting the rise time during which the loop filter voltage $V_C$ rises or the fall time during which the loop filter voltage $V_C$ falls. The fourth memory data may include, for example, digital input data for a switch that controls on/off states of the constant current source 331a, digital input data for a switch that controls on/off states of the constant current source 331b, and input data for a digital-to-analog converter that produces a bias voltage of a transistor. The fourth memory data is arbitrarily set by the control part 200 provided outside the oscillator circuit 100A.

Figure 7A:
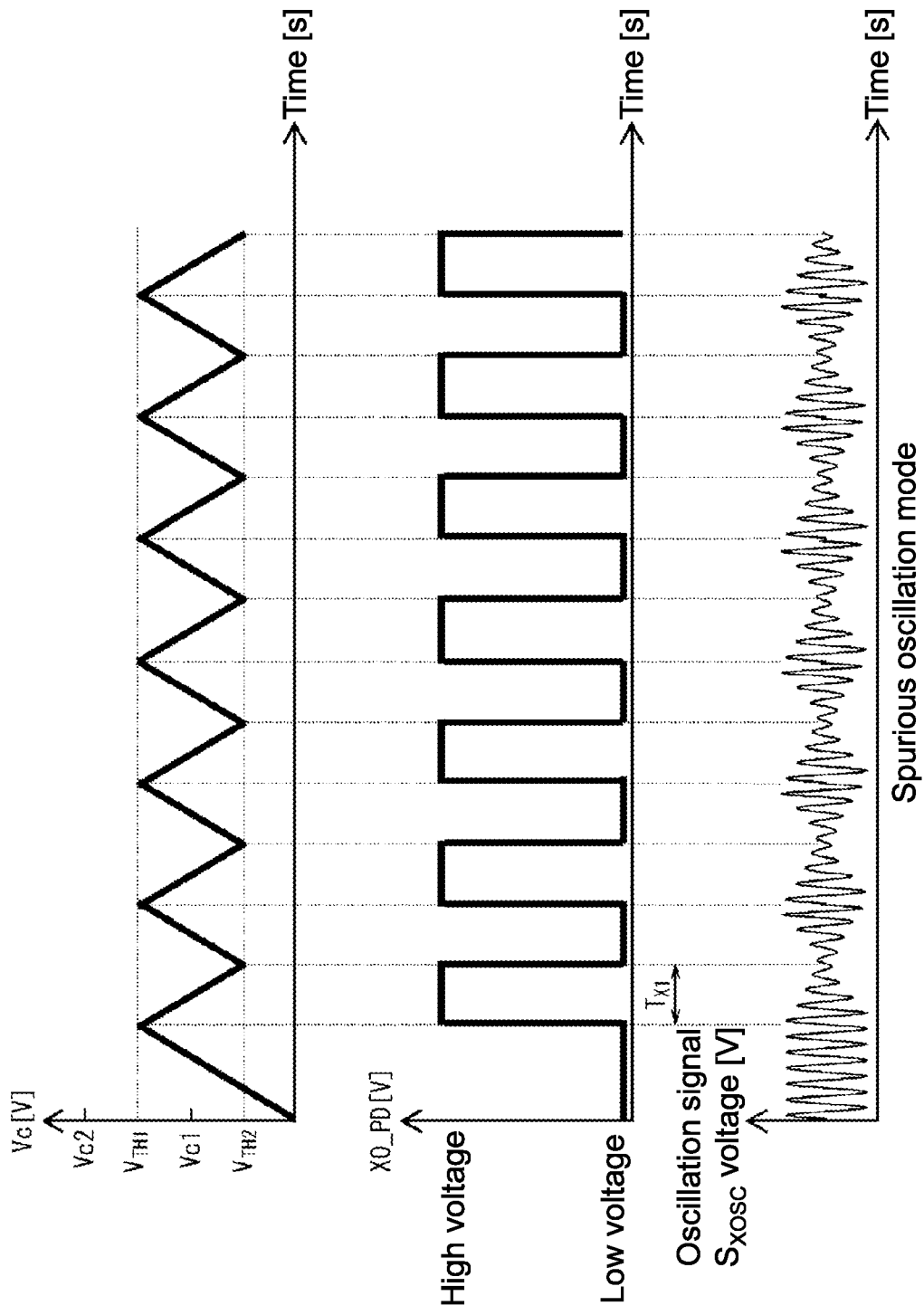
FIG. 7A is a timing chart illustrating an example of an operation of a conventional oscillator circuit.

For example, as shown in FIG. 7A, in the case where the charge pump current is greater than an optimum value (for example, about 1 mA), the rise time during which the loop filter voltage $V_C$ rises or the fall time during which the loop filter voltage $V_C$ falls becomes very short. In this case, since a time $T_{X1}$ (for example, about 100 μs) during which the control signal XO_PD is kept at "High voltage" may become very short, the oscillation signal $S_{XOSC}$ is unable to exit the spurious oscillation mode. To avoid such a state, the charge pump 33A adjusts the charge pump current using the fourth memory data so that the rise time during which the loop filter voltage $V_C$ rises or the fall time during which the loop filter voltage $V_C$ falls is lengthened.

Figure 7B:
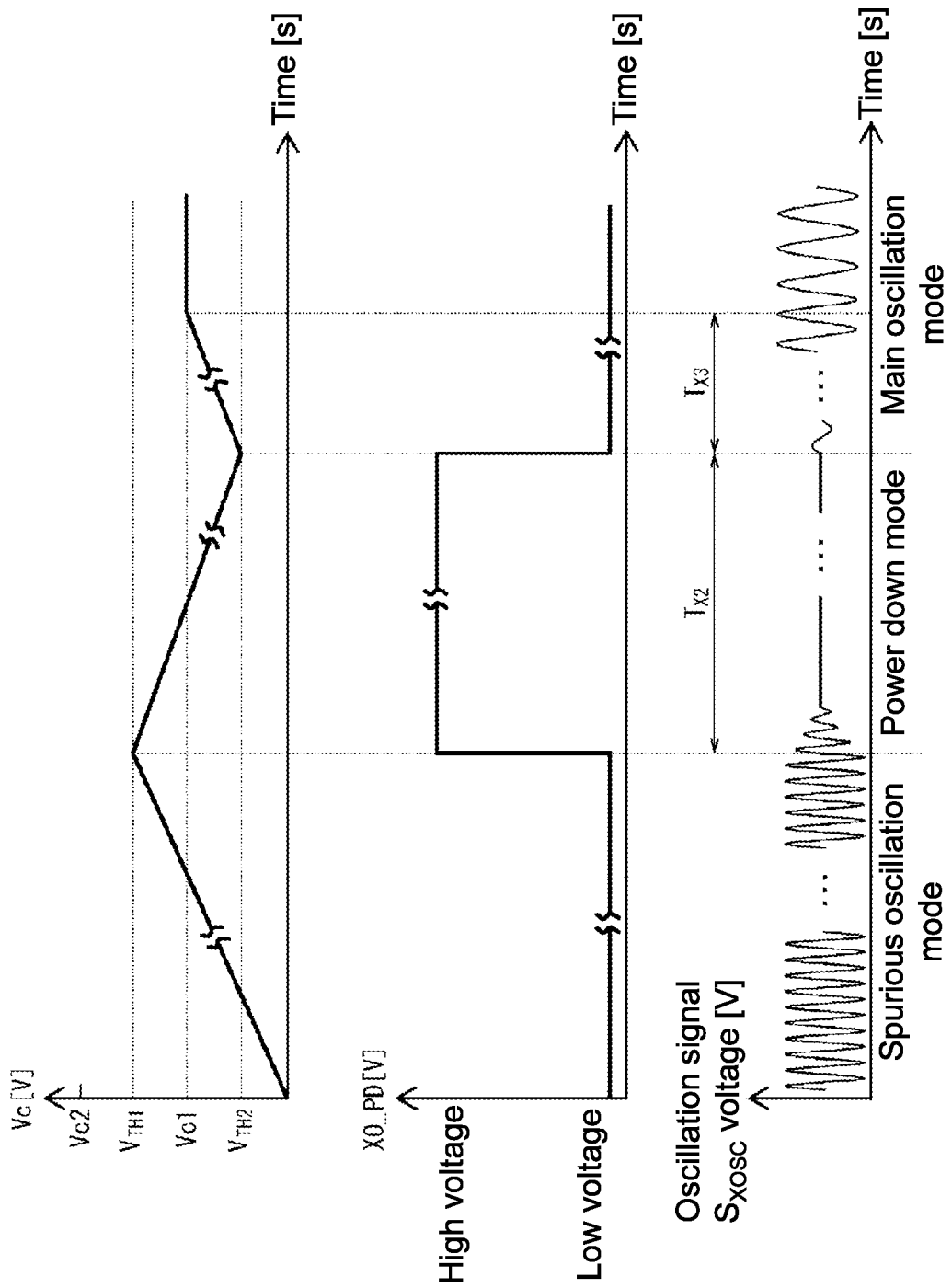
FIG. 7B is a timing chart illustrating an example of an operation of a conventional oscillator circuit.

For example, as shown in FIG. 7B, in the case where the charge pump current is less than the optimum value (for example, about 0.1 μA), the rise time during which the loop filter voltage $V_C$ rises or the fall time during which the loop filter voltage $V_C$ falls becomes very long. In this case, a time $T_{X2}$ (for example, about 1 s) during which the control signal XO_PD is kept at "High voltage" may become very long, and a convergence time $T_{X3}$ (for example, about 0.5 s) during which the oscillation signal $S_{XOSC}$ converges from the power down mode to the main oscillation mode may also become very long. To avoid such a state, the charge pump 33A adjusts the charge pump current using the fourth memory data so that the rise time during which the loop filter voltage $V_C$ rises or the fall time during which the loop filter voltage $V_C$ falls is shortened.

The storage 40A stores the fourth memory data in addition to the first memory data, the second memory data and the third memory data. The storage 40A may store any information used in operation of the oscillator circuit 100A. The storage 40A acquires the first memory data, the second memory data, the third memory data, and the fourth memory data from the control part 200 via the interface 50.

In the oscillator circuit 100A according to the second embodiment, the multiplication ratio of the frequency $f_{XOSC}$ of the oscillation signal $S_{XOSC}$ generated by the oscillator 20 is adjusted, and the oscillator 20 is controlled based on the loop filter voltage $V_C$ being the input voltage of the voltage controlled oscillator 35. Accordingly, the oscillator circuit 100A with high accuracy can be realized.

In the oscillator circuit 100A according to the second embodiment, by the charge pump 33A adjusting the charge pump current using the fourth memory data, the rise time during which the loop filter voltage $V_C$ rises or the fall time during which the loop filter voltage $V_C$ falls, in other words, a slope $dV_C/dt$ [V/s] on the graphs of the loop filter voltage $V_C$ [V] shown in FIG. 7A and FIG. 7B is changed, and a time for attenuating the oscillator 20 can be properly controlled. Accordingly, the oscillator circuit 100A can be realized in which, while the oscillation signal $S_{XOSC}$ is able to exit the spurious oscillation mode, a time required for the loop filter voltage $V_C$ to converge from the first threshold $V_{TH1}$ to the main oscillation equivalent voltage $V_{C1}$ is minimized.

Third Embodiment

Figure 8:
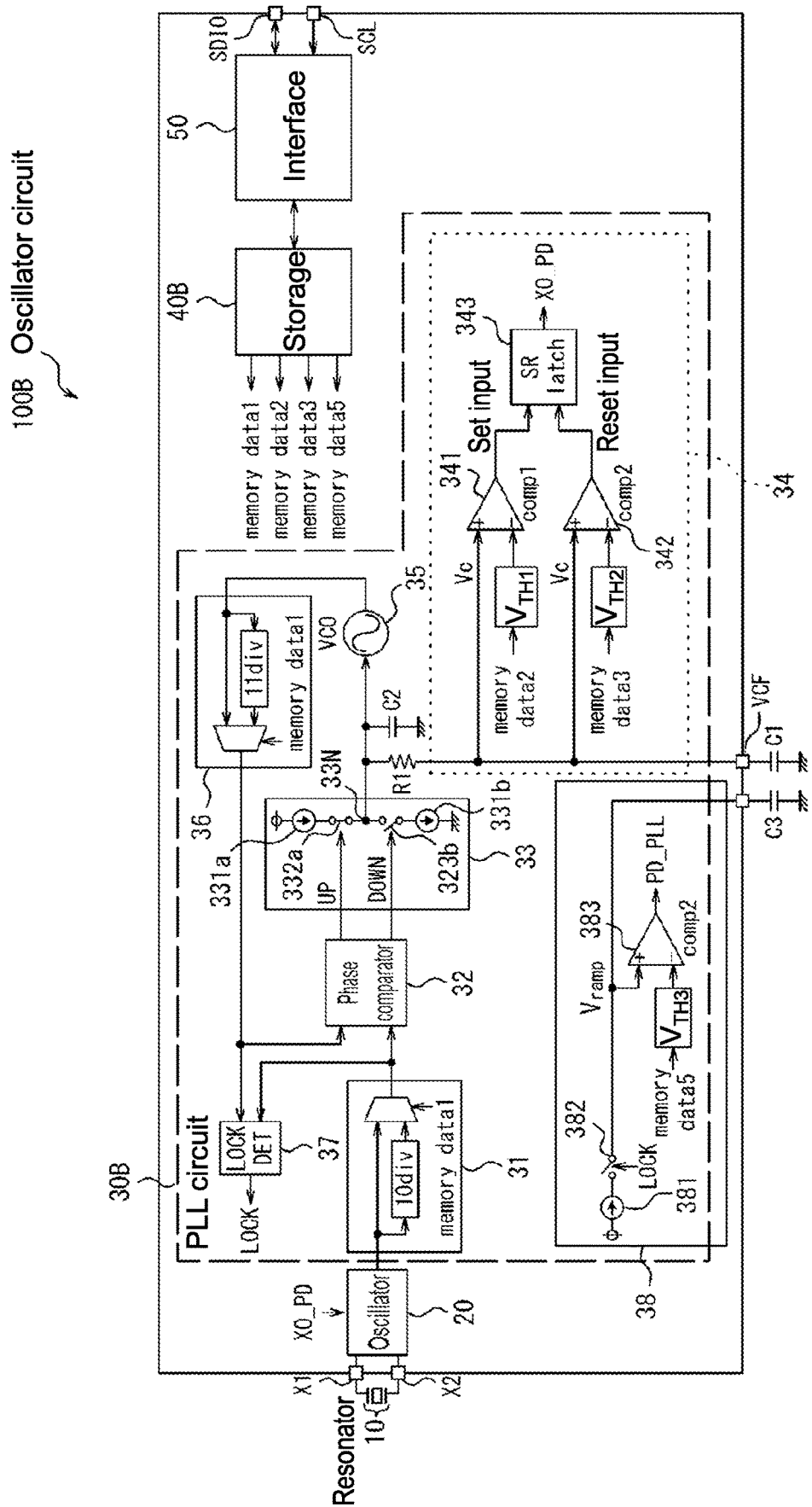
FIG. 8 illustrates an example of a configuration of an oscillator circuit according to a third embodiment.
Figure 9:
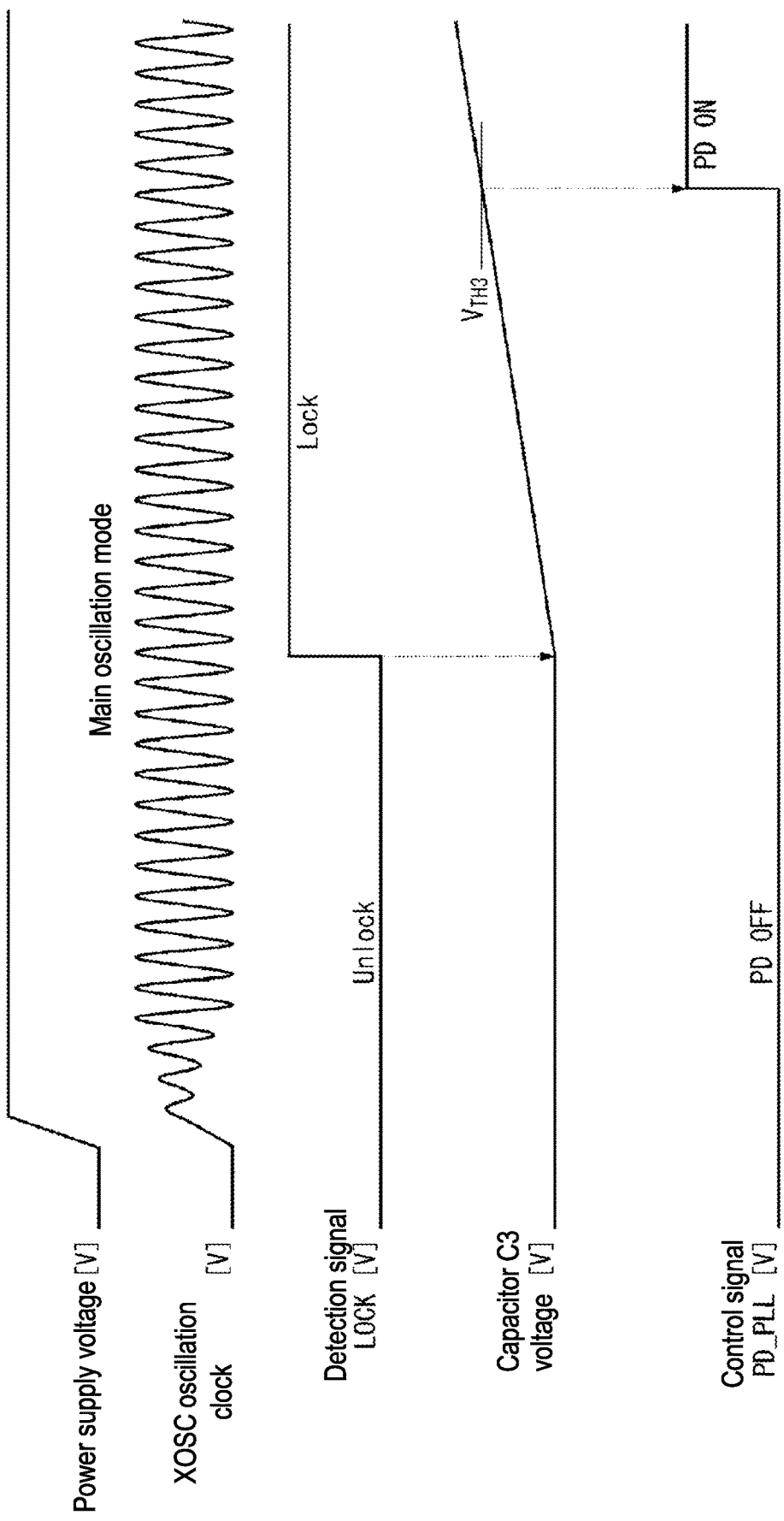
FIG. 9 is a timing chart illustrating an example of an operation of the oscillator circuit according to the third embodiment.

An example of a configuration of an oscillator circuit 100B according to a third embodiment is described with reference to FIG. 8 and FIG. 9.

The oscillator circuit 100B according to the third embodiment differs from the oscillator circuit 100 according to the first embodiment in that, while the oscillator circuit 100 according to the first embodiment does not include a lock detection circuit and a power down timer circuit, the oscillator circuit 100B according to the third embodiment includes a lock detection circuit 37 and a power down timer circuit 38. The other configurations are the same as those of the oscillator circuit 100 according to the first embodiment, and thus repeated description is omitted.

The oscillator circuit 100B includes the resonator 10, the oscillator 20, a PLL circuit 30B, a storage 40B, and the interface 50. The PLL circuit 30B includes the first frequency divider 31, the phase comparator 32, the charge pump 33, the attenuation control circuit 34, the voltage controlled oscillator 35, the second frequency divider 36, the lock detection circuit 37, and the power down timer circuit 38.

Based on a signal (the frequency divided signal $S_{XOSC/DIV}$ and the frequency divided signal $S_{VCO/DIV}$ described above) input to the phase comparator 32, the lock detection circuit 37 determines whether the PLL circuit 30B is in a locked state, that is, whether the PLL circuit 30B has detected the main oscillation mode of the oscillation signal $S_{XOSC}$ and is in a stable state, and generates a detection signal LOCK. The lock detection circuit 37 outputs the detection signal LOCK to the power down timer circuit 38. A configuration of the lock detection circuit 37 is not particularly limited and a known configuration may be adopted.

For example, in the case of determining that the PLL circuit 30B is in the locked state, the lock detection circuit 37 generates a high level signal as the detection signal LOCK and outputs the same to the power down timer circuit 38. For example, in the case of determining that the PLL circuit 30B is not in the locked state, the lock detection circuit 37 generates a low level signal as the detection signal LOCK and outputs the same to the power down timer circuit 38.

Based on the detection signal LOCK input from the lock detection circuit 37, the power down timer circuit 38 generates a control signal PD_PLL for controlling the PLL circuit 30B using fifth memory data.

The fifth memory data is determination data for determining whether to power down the PLL circuit 30B. The fifth memory data may include, for example, in the case where a power supply voltage is set to VDD, data indicating a third threshold $V_{TH3}$ (0.1 V<third threshold $V_{TH3}$<VDD−0.1 V) being a voltage greater than 0.1 V and less than VDD−0.1 V. The fifth memory data is arbitrarily set by the control part 200 provided outside the oscillator circuit 100B.

A configuration of the power down timer circuit 38 is not particularly limited. For example, the power down timer circuit 38 may include a constant current source 381, a switching transistor 382, and a comparator 383.

For example, in the power down timer circuit 38, when a high level signal is input from the lock detection circuit 37, the switching transistor 382 is turned on, a capacitor C3 is charged with a predetermined current from the constant current source 381, a voltage of the capacitor C3 is gradually raised, and a ramp voltage $V_{ramp}$ is generated at a positive terminal of the comparator 383. The comparator 383 compares the ramp voltage $V_{ramp}$ at the positive terminal with the third threshold $V_{TH3}$ at a negative terminal, and generates the control signal PD_PLL based on a comparison result.

Specifically, in the case where the ramp voltage $V_{ramp}$ is greater than the third threshold $V_{TH3}$, the power down timer circuit 38 generates a high level signal as the control signal PD_PLL to power down the PLL circuit 30B. Alternatively, in the case where the ramp voltage $V_{ramp}$ is less than or equal to the third threshold $V_{TH3}$, the power down timer circuit 38 generates a low level signal as the control signal PD_PLL to prevent the PLL circuit 30B from being powered down.

For example, in the power down timer circuit 38, when a low level signal is input from the lock detection circuit 37, the switching transistor 382 is turned off and the voltage of the capacitor C3 is prevented from rising. The power down timer circuit 38 generates a low level signal as the control signal PD_PLL to prevent the PLL circuit 30B from being powered down.

The storage 40B stores the fifth memory data in addition to the first memory data, the second memory data and the third memory data. The storage 40B may store any information used in operation of the oscillator circuit 100B. The storage 40B acquires the first memory data, the second memory data, the third memory data, and the fifth memory data from the control part 200 via the interface 50.

In the oscillator circuit 100B according to the third embodiment, the multiplication ratio of the frequency $f_{XOSC}$ of the oscillation signal $S_{XOSC}$ generated by the oscillator 20 is adjusted, and the oscillator 20 is controlled based on the loop filter voltage $V_C$ being the input voltage of the voltage controlled oscillator 35. Accordingly, the oscillator circuit 100B with high accuracy can be realized.

In the oscillator circuit 100B according to the third embodiment, the PLL circuit 30B is powered down after it is detected that the PLL circuit 30B is in the locked state. That is, in the oscillator circuit 100B according to the third embodiment, after the oscillation signal $S_{XOSC}$ has been put into the main oscillation mode and has stabilized, the PLL circuit 30B is powered down. Accordingly, it can be suppressed that operation noise of the PLL circuit 30B interferes into the oscillator circuit 100B that is noise-sensitive via a power supply and a bulk or the like in the circuit. Deterioration of noise characteristics can be prevented, and a highly stable oscillator circuit 100B can be realized.

Fourth Embodiment

Figure 10:
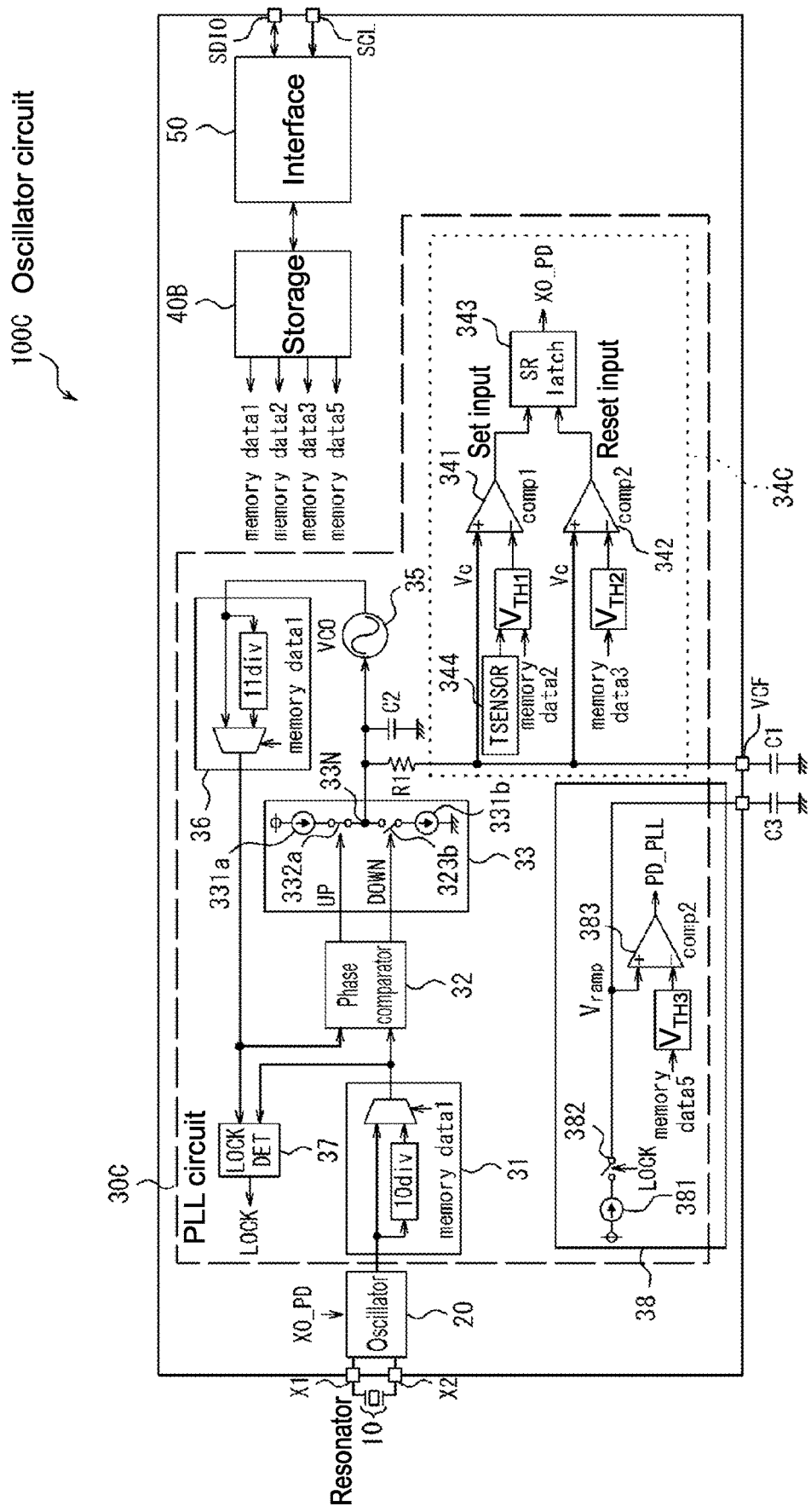
FIG. 10 illustrates an example of a configuration of an oscillator circuit according to a fourth embodiment.

An example of a configuration of an oscillator circuit 100C according to a fourth embodiment is described with reference to FIG. 10, FIG. 11A and FIG. 11B.

The oscillator circuit 100C according to the fourth embodiment differs from the oscillator circuit 100B according to the third embodiment in that, while the attenuation control circuit 34 in the oscillator circuit 100B according to the third embodiment does not include a temperature sensor, an attenuation control circuit 34C in the oscillator circuit 100C according to the fourth embodiment includes a temperature sensor 344. The other configurations are the same as those of the oscillator circuit 100B according to the third embodiment, and thus repeated description is omitted.

The oscillator circuit 100C includes the resonator 10, the oscillator 20, a PLL circuit 30C, the storage 40B, and the interface 50. The PLL circuit 30C includes the first frequency divider 31, the phase comparator 32, the charge pump 33, the attenuation control circuit 34C, the voltage controlled oscillator 35, the second frequency divider 36, the lock detection circuit 37, and the power down timer circuit 38.

The attenuation control circuit 34C detects the loop filter voltage $V_C$, and, based on the loop filter voltage $V_C$, generates the control signal XO_PD for controlling the oscillator 20 using a sensor signal input from the temperature sensor 344 in addition to the second memory data and the third memory data. The attenuation control circuit 34C outputs the control signal XO_PD to the oscillator 20.

The attenuation control circuit 34C may include, for example, the comparator 341, the comparator 342, the SR latch circuit 343, and the temperature sensor 344.

The temperature sensor 344 measures a temperature of the PLL circuit 30C and generates the sensor signal as a measurement result. The temperature sensor 344 outputs the sensor signal to the comparator 341. For example, in the case where a measured temperature is low (for example, about −40° C.), the temperature sensor 344 outputs the sensor signal indicating the low temperature to the comparator 341. For example, in the case where the measured temperature is room temperature (for example, about 25° C.), the temperature sensor 344 outputs the sensor signal indicating the room temperature to the comparator 341. For example, in the case where the measured temperature is high (for example, about 105° C.), the temperature sensor 344 outputs the sensor signal indicating the high temperature to the comparator 341.

The comparator 341 compares the loop filter voltage $V_C$ with the first threshold $V_{TH1}$ using the sensor signal input from the temperature sensor 344, and outputs a comparison result to the Set terminal of the SR latch circuit 343.

Figure 11A:
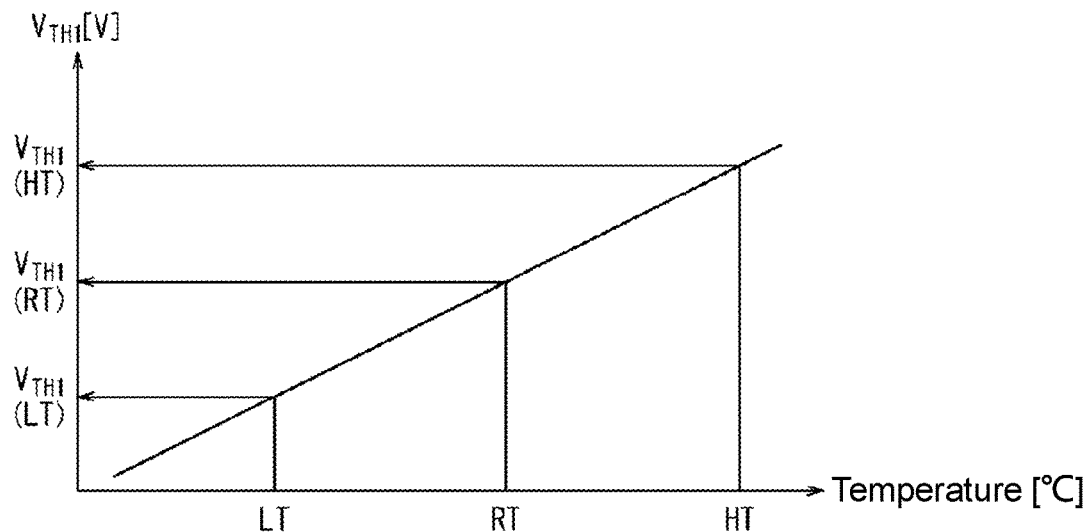
FIG. 11A illustrates an example of a relationship between a loop filter voltage and an oscillation frequency of a voltage controlled oscillator in a PLL circuit according to the fourth embodiment.

As shown in FIG. 11A, the first threshold $V_{TH1}$ changes in its characteristics depending on the temperature. The first threshold $V_{TH1}$ increases in the order of a first threshold $V_{TH1}$(LT) at low temperature, a first threshold $V_{TH1}$(RT) at room temperature, and a first threshold $V_{TH1}$(HT) at high temperature. The temperature characteristic of the first threshold $V_{TH1}$ may be set by the control part 200 based on the sensor signal of the temperature sensor 344. The control part 200 is able to easily obtain the temperature characteristic of the first threshold $V_{TH1}$ by, for example, amplifying the voltage of the temperature sensor 344 with an optimum gain by a known amplifier or the like. Of course, the temperature characteristic of the first threshold $V_{TH1}$ is not limited to linear, but may be of an N-th order (N is an integer equal to or greater than 2). As the order increases, highly accurate threshold control with respect to a temperature change becomes possible. The temperature characteristic of the first threshold $V_{TH1}$ is not limited to a linear or N-order polynomial, and may be a continuous function such as a trigonometric function, an exponential function, a logarithmic function, or a sigmoid function.

Figure 11B:
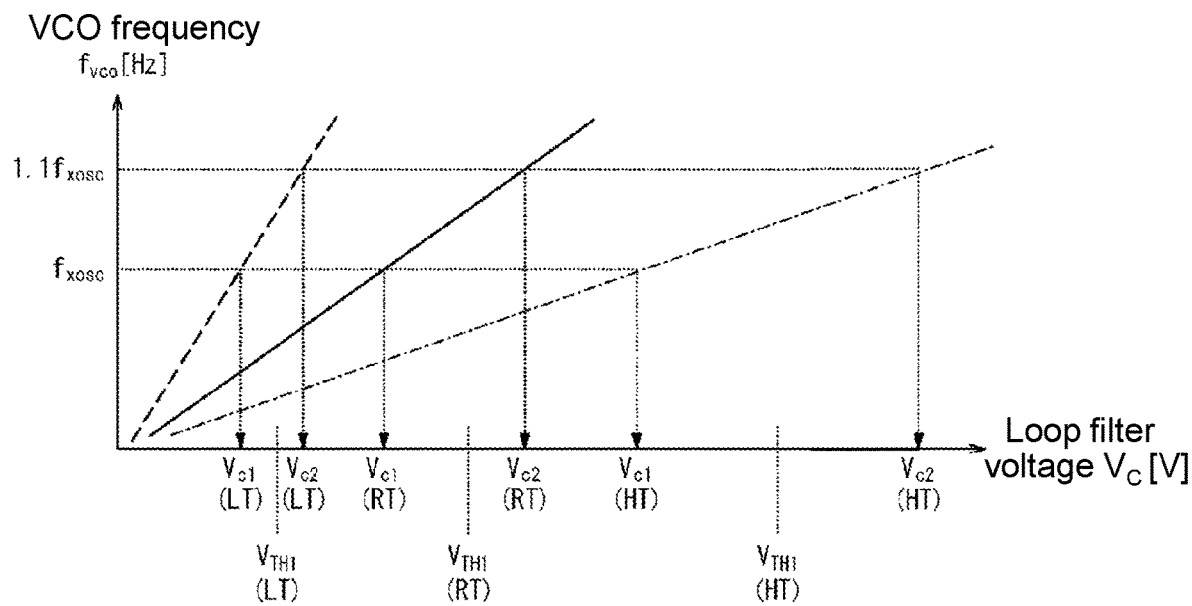
FIG. 11B illustrates an example of a relationship between the loop filter voltage and the oscillation frequency of the voltage controlled oscillator in the PLL circuit according to the fourth embodiment.

As shown in FIG. 11B, the main oscillation equivalent voltage $V_{C1}$ and the spurious oscillation equivalent voltage $V_{C2}$ also change in characteristics depending on the temperature. The main oscillation equivalent voltage $V_{C1}$ increases in the order of a main oscillation equivalent voltage $V_{C1}$(LT) at low temperature, a main oscillation equivalent voltage $V_{C1}$(RT) at room temperature, and a main oscillation equivalent voltage $V_{C1}$(HT) at high temperature. The spurious oscillation equivalent voltage $V_{C2}$ increases in the order of a spurious oscillation equivalent voltage $V_{C2}$(LT) at low temperature, a spurious oscillation equivalent voltage $V_{C2}$(RT) at room temperature, and a spurious oscillation equivalent voltage $V_{C2}$(HT) at high temperature.

For example, in the case where the loop filter voltage $V_C$ is greater than the first threshold $V_{TH1}$(LT) at low temperature that is a voltage greater than the main oscillation equivalent voltage $V_{C1}$(LT) at low temperature and less than the spurious oscillation equivalent voltage $V_{C2}$(LT) at low temperature ($V_{C1}$(LT)<$V_{TH1}$(LT)<$V_{C2}$(LT)), the comparator 341 generates a high level signal; in the case where the loop filter voltage $V_C$ is less than or equal to the first threshold $V_{TH1}$(LT) at low temperature, the comparator 341 generates a low level signal.

For example, in the case where the loop filter voltage $V_C$ is greater than the first threshold $V_{TH1}$(RT) at room temperature that is a voltage greater than the main oscillation equivalent voltage $V_{C1}$(RT) at room temperature and less than the spurious oscillation equivalent voltage $V_{C2}$(RT) at room temperature ($V_{C1}$(RT)<$V_{TH1}$(RT)<$V_{C2}$(RT)), the comparator 341 generates a high level signal; in the case where the loop filter voltage $V_C$ is less than or equal to the first threshold $V_{TH1}$(RT) at room temperature, the comparator 341 generates a low level signal.

For example, in the case where the loop filter voltage $V_C$ is greater than the first threshold $V_{TH1}$(HT) at high temperature that is a voltage greater than the main oscillation equivalent voltage $V_{C1}$(HT) at high temperature and less than the spurious oscillation equivalent voltage $V_{C2}$(HT) at high temperature ($V_{C1}$(HT)<$V_{TH1}$(HT)<$V_{C2}$(HT)), the comparator 341 generates a high level signal; in the case where the loop filter voltage $V_C$ is less than or equal to the first threshold $V_{TH1}$(HT) at high temperature, the comparator 341 generates a low level signal.

In the oscillator circuit 100C according to the fourth embodiment, the multiplication ratio of the frequency $f_{XOSC}$ of the oscillation signal $S_{XOSC}$ generated by the oscillator 20 is adjusted, and the oscillator 20 is controlled based on the loop filter voltage $V_C$ being the input voltage of the voltage controlled oscillator 35. Accordingly, the oscillator circuit 100C with high accuracy can be realized.

In the oscillator circuit 100C according to the fourth embodiment, the first threshold $V_{TH1}$ serving as the determination data for determining whether to attenuate the oscillator 20 can be adjusted to an optimum value in correspondence with a temperature change. Accordingly, the oscillator circuit 100C can be realized in which determination error due to temperature change is reduced.

Fifth Embodiment

Figure 12:
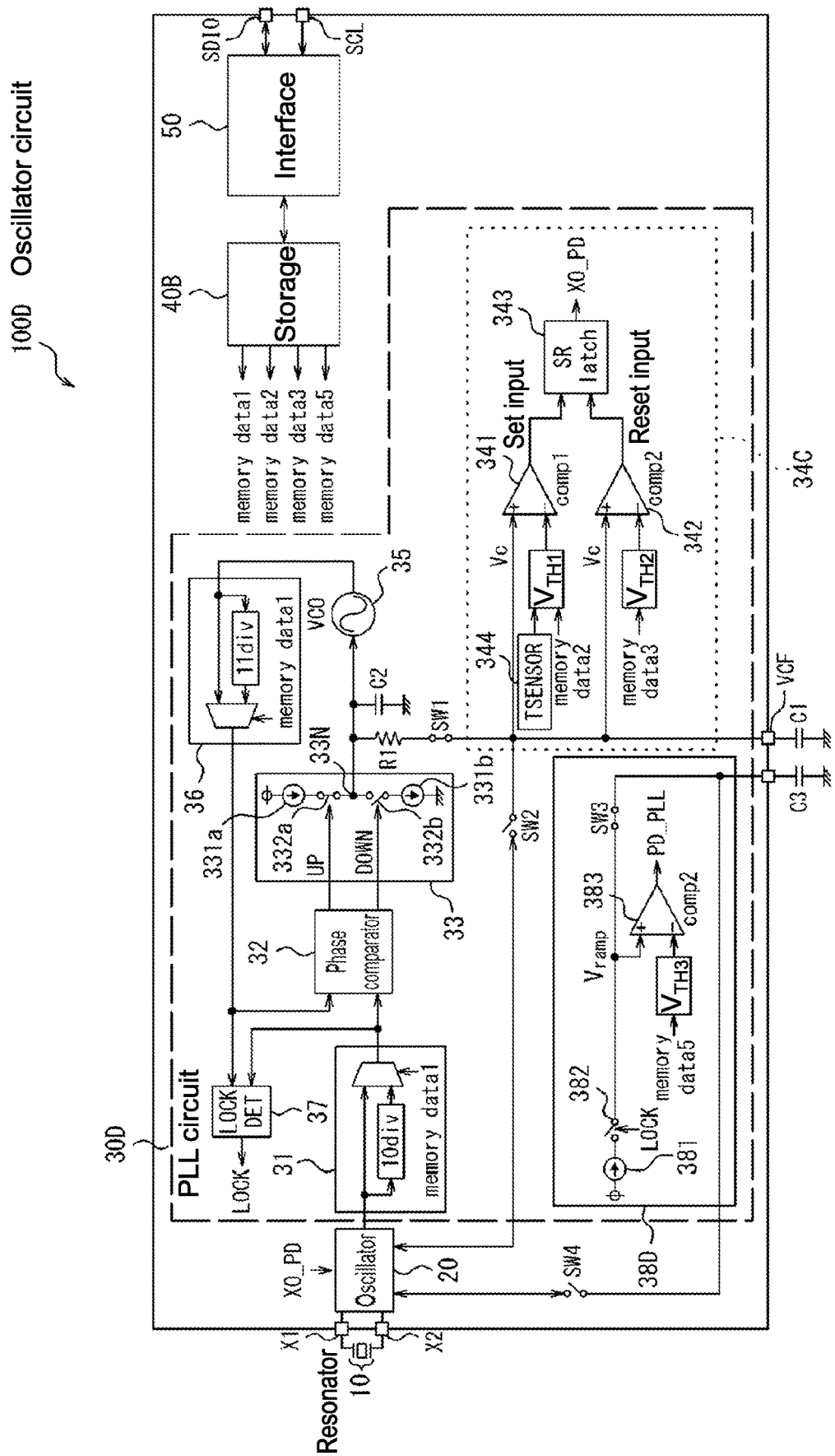
FIG. 12 illustrates an example of a configuration of an oscillator circuit according to a fifth embodiment.
Figure 13:
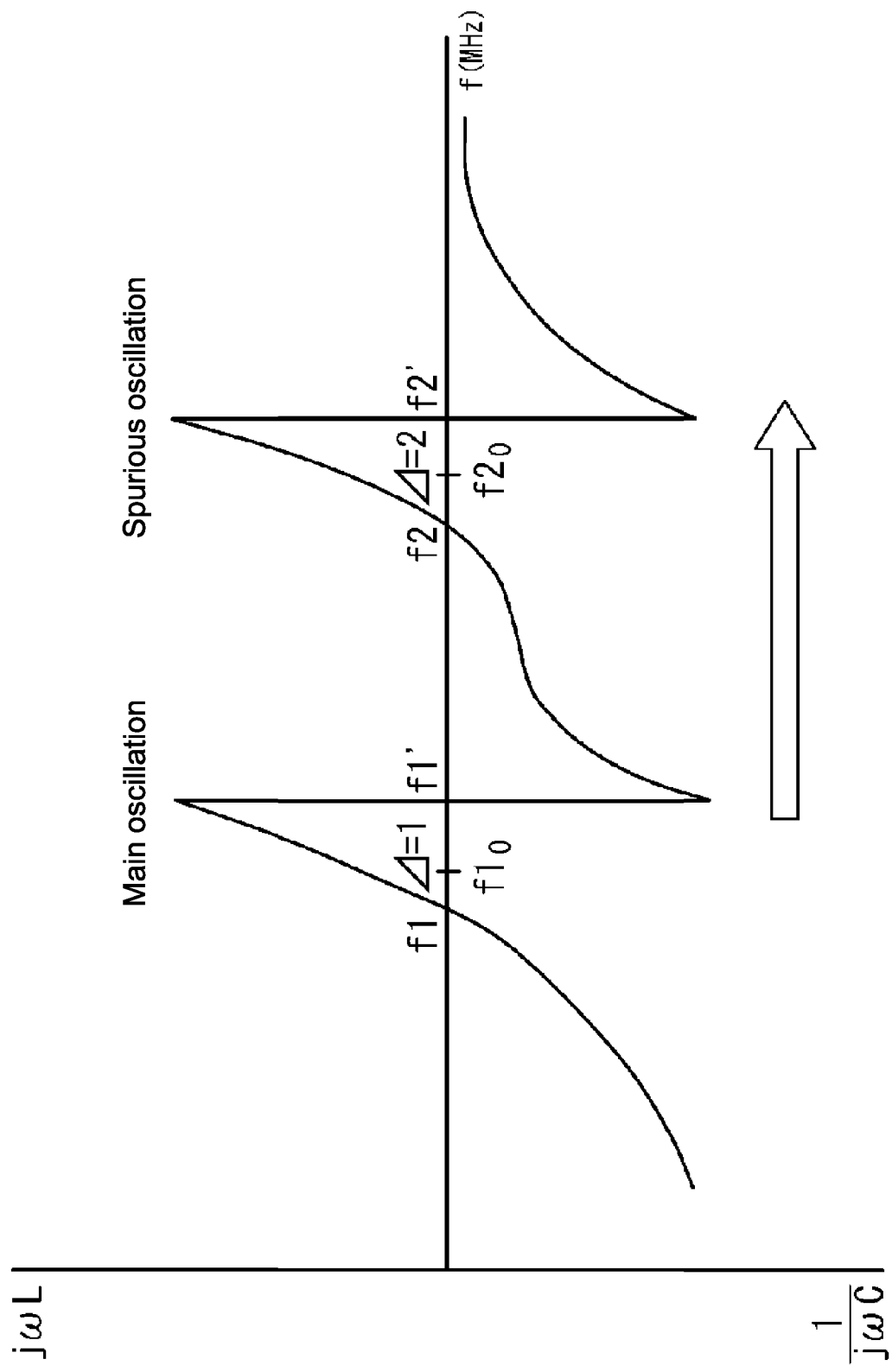
FIG. 13 illustrates an example of an impedance characteristic in a crystal resonator.

An example of a configuration of an oscillator circuit 100D according to a fifth embodiment is described with reference to FIG. 12.

The oscillator circuit 100D according to the fifth embodiment differs from the oscillator circuit 100C according to the fourth embodiment in that the oscillator circuit 100D according to the fifth embodiment includes a switching transistor SW1 between the attenuation control circuit 34C and a resistor R1, a switching transistor SW2 between the attenuation control circuit 34C and the oscillator 20, a switching transistor SW3 in a power down timer circuit 38D, and a switching transistor SW4 between the power down timer circuit 38D and the oscillator 20. The other configurations are the same as those of the oscillator circuit 100C according to the fourth embodiment, and thus repeated description is omitted.

The oscillator circuit 100D includes the resonator 10, the oscillator 20, a PLL circuit 30D, the storage 40B, and the interface 50. The PLL circuit 30D includes the first frequency divider 31, the phase comparator 32, the charge pump 33, the attenuation control circuit 34C, the voltage controlled oscillator 35, the second frequency divider 36, the lock detection circuit 37, and the power down timer circuit 38D.

The oscillator circuit 100D includes the switching transistor SW1 between the attenuation control circuit 34C and the resistor R1, the switching transistor SW2 between the attenuation control circuit 34C and the oscillator 20, the switching transistor SW3 in the power down timer circuit 38D, and the switching transistor SW4 between the power down timer circuit 38D and the oscillator 20.

In the oscillator circuit 100D, based on on/off of the switching transistor SW1, the switching transistor SW2, the switching transistor SW3, and the switching transistor SW4, an external filter (for example, a capacitor C1 or a capacitor C3) is properly used. For example, in the case where the PLL circuit 30D is powered down, the oscillator circuit 100D uses the external filter as a noise reduction filter of the oscillator 20. For example, in the case where the PLL circuit 30D is not powered down, the oscillator circuit 100D uses the external filter as a loop filter of the PLL circuit 30D or in the power down timer circuit 38D of the PLL circuit 30D.

The external filter has a capacitor that is too large to be built in an integrated circuit. Hence, for example, if the external filter is used for the loop filter of the PLL circuit 30D, the oscillator circuit 100D is able to secure sufficient time to put the oscillation signal $S_{XOSC}$ in the oscillator 20 into the power down mode. Alternatively, for example, if the external filter is used in the power down timer circuit 38D of the PLL circuit 30D, the oscillator circuit 100D is able to secure sufficient waiting time before the PLL circuit 30D is powered down.

As a noise reduction node of the oscillator 20, for example, an analog temperature compensating voltage node or an analog voltage node for correcting variation with time of an oscillation frequency may be used.

In the oscillator circuit 100D according to the fifth embodiment, the multiplication ratio of the frequency $f_{XOSC}$ of the oscillation signal $S_{XOSC}$ generated by the oscillator 20 is adjusted, and the oscillator 20 is controlled based on the loop filter voltage $V_C$ being the input voltage of the voltage controlled oscillator 35. Accordingly, the oscillator circuit 100D with high accuracy can be realized.

In the oscillator circuit 100D according to the fifth embodiment, based on on/off of each switching transistor, the external filter is properly used. Accordingly, since there is no need to separately prepare a filter for the oscillator 20 and a filter for the PLL circuit 30D, the oscillator circuit 100D can be realized in which package size is reduced. The oscillator circuit 100D like this is particularly useful for a small base station or the like.

Although the above embodiments have been described as representative examples, it will be apparent to those skilled in the art that many modifications and substitutions may be made within the spirit and scope of the disclosure. Accordingly, the present disclosure should not be construed as limited by the embodiments described above, and various modifications and changes are possible without departing from the scope of the appended claims. For example, it is possible to combine a plurality of configuration blocks described in the configuration diagrams of the embodiments into one, or to divide one configuration block. It is possible to combine a plurality of steps described in the flowcharts of the embodiments into one, or to divide one step.

What is claimed is:

1. An oscillator circuit comprising:
an oscillator, oscillating a resonator and generating a first oscillation signal; and
a PLL circuit, adjusting a ratio between a first frequency of the first oscillation signal and a second frequency of a second oscillation signal output from a voltage controlled oscillator, and controlling the oscillator based on a loop filter voltage being an input voltage of the voltage controlled oscillator, wherein the PLL circuit comprises:
a frequency divider circuit, adjusting the ratio between the first frequency and the second frequency so that the loop filter voltage becomes a spurious oscillation equivalent voltage, wherein the spurious oscillation equivalent voltage is the loop filter voltage when the resonator produces a spurious oscillation.

2. The oscillator circuit according to claim 1, wherein the PLL circuit further comprises:
an attenuation control circuit, controlling oscillation of the oscillator in response to the loop filter voltage.

3. The oscillator circuit according to claim 2, wherein the attenuation control circuit attenuates oscillation of the oscillator in response to the loop filter voltage being greater than a first threshold that is a voltage greater than a main oscillation equivalent voltage and less than a spurious oscillation equivalent voltage, and the attenuation control circuit oscillates the oscillator in response to the loop filter voltage being less than a second threshold that is a voltage less than the main oscillation equivalent voltage.

4. The oscillator circuit according to claim 1, wherein the PLL circuit adjusts the ratio between the first frequency and the second frequency so as to be 1:1 or a ratio between a frequency during a main oscillation and a frequency during a spurious oscillation.

5. The oscillator circuit according to claim 4, wherein the ratio between the frequency during the main oscillation and the frequency during the spurious oscillation is 10:11.

6. The oscillator circuit according to claim 1, wherein the PLL circuit further comprises:
a charge pump, adjusting a rise time during which the loop filter voltage rises or a fall time during which the loop filter voltage falls.

7. The oscillator circuit according to claim 1, wherein the PLL circuit further comprises:
a lock detection circuit, detecting whether the PLL circuit is in a locked state; and
a power down timer circuit, powering down the PLL circuit after it is detected that the PLL circuit is in the locked state.

8. The oscillator circuit according to claim 2, wherein the attenuation control circuit comprises a temperature sensor measuring a temperature of the PLL circuit; and
the attenuation control circuit controls the oscillator based on a measurement result of the temperature sensor.

9. The oscillator circuit according to claim 1, wherein the PLL circuit further comprises:
a phase comparator, generating a phase comparison signal corresponding to a phase difference between the first oscillation signal and the second oscillation signal; and
a charge pump, receiving the phase comparison signal, and adjusting a rise time during which the loop filter voltage rises or a fall time during which the loop filter voltage falls.

10. An oscillation method comprising:
by an oscillator, oscillating a resonator and generating a first oscillation signal;
by a PLL circuit, adjusting a ratio between a first frequency of the first oscillation signal and a second frequency of a second oscillation signal output from a voltage controlled oscillator;
by the PLL circuit, controlling the oscillator based on a loop filter voltage being an input voltage of the voltage controlled oscillator; and
by a frequency divider circuit of the PLL circuit, adjusting the ratio between the first frequency and the second frequency so that the loop filter voltage becomes a spurious oscillation equivalent voltage, wherein the spurious oscillation equivalent voltage is the loop filter voltage when the resonator produces a spurious oscillation.

11. A method for adjusting an oscillator circuit that comprises an oscillator, a PLL circuit that comprises a frequency divider circuit, and a control part, the method comprising:
by the oscillator, oscillating a resonator and generating a first oscillation signal;
in a first adjustment step, adjusting a ratio between a first frequency of the first oscillation signal and a second frequency of a second oscillation signal output from a voltage controlled oscillator by the control part so that a loop filter voltage input to a voltage controlled oscillator provided in the PLL circuit becomes a spurious oscillation equivalent voltage, wherein the spurious oscillation equivalent voltage is the loop filter voltage when the resonator produces a spurious oscillation;
in a second adjustment step, adjusting a first threshold by the control part based on the loop filter voltage adjusted in the first adjustment step;
in a third adjustment step, adjusting the ratio between the first frequency of the first oscillation signal and the second frequency of the second oscillation signal output from the voltage controlled oscillator by the control part so that the loop filter voltage adjusted in the first adjustment step becomes a main oscillation equivalent voltage; and
in a fourth adjustment step, adjusting a second threshold by the control part based on the loop filter voltage adjusted in the third adjustment step.

12. An oscillator circuit comprising:
an oscillator, oscillating a resonator and generating a first oscillation signal; and
a PLL circuit, adjusting a ratio between a first frequency of the first oscillation signal and a second frequency of a second oscillation signal output from a voltage controlled oscillator, and controlling the oscillator based on a loop filter voltage being an input voltage of the voltage controlled oscillator, wherein
the PLL circuit further comprises:
an attenuation control circuit, controlling oscillation of the oscillator in response to the loop filter voltage, and
the attenuation control circuit powers down the oscillator in response to the loop filter voltage being greater than a first threshold that is a voltage greater than a main oscillation equivalent voltage and less than a spurious oscillation equivalent voltage, and the attenuation control circuit oscillates the oscillator in response to the loop filter voltage being less than a second threshold that is a voltage less than the main oscillation equivalent voltage.

* * * * *